(12) United States Patent
Kumar et al.

(10) Patent No.: US 6,838,115 B2
(45) Date of Patent: Jan. 4, 2005

(54) THERMAL PROCESSING SYSTEM AND METHODS FOR FORMING LOW-K DIELECTRIC FILMS SUITABLE FOR INCORPORATION INTO MICROELECTRONIC DEVICES

(75) Inventors: Devendra Kumar, Los Altos, CA (US); Jeffrey D. Womack, Lake Oswego, OR (US); Vuong P. Nguyen, Allen, TX (US); Jack S. Kasahara, Los Gatos, CA (US); Sokol Ibrani, Pleasanton, CA (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/903,114

(22) Filed: Jul. 11, 2001

(65) Prior Publication Data

US 2002/0132052 A1 Sep. 19, 2002

Related U.S. Application Data

(60) Provisional application No. 60/325,784, filed on Jul. 12, 2000.

(51) Int. Cl.[7] .............................. B05D 5/12; B05D 3/02
(52) U.S. Cl. ...................... 427/58; 427/240; 427/372.2; 427/374.1; 427/379; 427/385.5; 427/398.4; 427/350
(58) Field of Search ................................ 427/240, 287, 427/372.2, 374.1, 379, 385.5, 389.7, 398.4, 425; 118/52, 320; 219/390, 405, 411

(56) References Cited

U.S. PATENT DOCUMENTS

| | | | |
|---|---|---|---|
| 5,462,603 A | | 10/1995 | Murakami |
| 5,620,560 A | * | 4/1997 | Akimoto et al. ............... 216/41 |
| 5,772,770 A | | 6/1998 | Suda et al. |
| 5,884,009 A | | 3/1999 | Okase |
| 5,968,691 A | * | 10/1999 | Yoshioka et al. ............. 430/30 |
| 6,002,109 A | | 12/1999 | Johnsgard et al. |
| 6,015,594 A | | 1/2000 | Yoshikawa |
| 6,042,994 A | * | 3/2000 | Yang et al. ................. 430/296 |
| 6,072,163 A | * | 6/2000 | Armstrong et al. ......... 219/497 |
| 6,198,074 B1 | * | 3/2001 | Savas ......................... 219/390 |
| 6,215,106 B1 | * | 4/2001 | Boas et al. ................. 219/390 |
| 6,307,184 B1 | * | 10/2001 | Womack et al. ............ 219/390 |

FOREIGN PATENT DOCUMENTS

| | | |
|---|---|---|
| EP | 0 843 347 | 5/1998 |
| JP | 5-5326453 | 12/1993 |
| JP | 8-8310896 | 11/1996 |
| JP | 10-233370 | 9/1998 |

* cited by examiner

Primary Examiner—Brian K. Talbot
(74) Attorney, Agent, or Firm—Kagan Binder, PLLC

(57) ABSTRACT

Single wafer processing methods and systems for manufacturing films having low-k properties and low indices of refraction. The methods incorporate a processing station in which both curing and post-cure, in situ gas cooling take place.

39 Claims, 9 Drawing Sheets

THERMAL PROCESSING SYSTEM AND METHODS FOR FORMING LOW-K DIELECTRIC FILMS SUITABLE FOR INCORPORATION INTO MICROELECTRONIC DEVICES

CLAIM OF PRIORITY

This application claims priority from U.S. Ser. No. 60/325,784, filed Jul. 12, 2000, for THERMAL PROCESSING SYSTEM AND METHODS FOR FORMING LOW-K DIELECTRIC FILMS SUITABLE FOR INCORPORATION INTO MICROELECTRONIC DEVICES, for which a petition to convert to a provisional application was previously filed on Mar. 27, 2001, but serial number of the provisional has yet to be assigned.

FIELD OF THE INVENTION

The present invention relates to systems and methods for forming dielectric films suitable for microelectronic applications, e.g., for use in forming microelectronic interconnect structures in logic and memory devices. In particular, the present invention is directed to integrated systems and methods in which such films are formed on a microelectronic substrate by thermally curing a dielectric precursor in a process chamber and then cooling the cured material in situ before the substrate is removed from the chamber.

BACKGROUND OF THE INVENTION

As the operating frequencies of electronic devices enter the gigahertz range and as the dimensions of device features become smaller, insulating materials with low dielectric constants (low-k dielectric materials) are needed to achieve reasonable power consumption, to reduce signal delay, and to minimize interconnect crosstalk in high performance ULSI circuits. Materials with low dielectric constants are strongly desired in many microelectronic device applications, including both gap filling and Damascene applications. The dielectric constant of a dielectric material is one property indicative of its quality. Other characteristics indicative of the quality of a dielectric material include mechanical properties, index of refraction, uniformity, thermal stability, manufacturability, integration with Cu or Al and the like.

Most dielectric films are formed using either a spin coating approach, or a chemical vapor deposition approach, e.g., PECVD or HDP. In the spin coating approach, a spin coatable solution containing a dielectric film precursor (usually one or more curable monomers, oligomers, and/or polymers) dissolved in a suitable solvent is spin coated onto a rotating substrate, such as a microelectronic device precursor (e.g., a silicon wafer) or the like, to form a uniform, relatively thin film coating on the substrate. The coated substrate is then baked at a temperature typically in the range of 100° C. to about 325° C. in order to remove the solvent, dry the coating, and advance the dielectric material to the B-stage of polymerization. The coating is then cured, i.e., advanced to the C-stage of polymerization, by heating the substrate at a suitable curing temperature typically in the range of about 350° C. to about 450° C.

The cured dielectric films are generally collectively referred to as low-k spin on dielectric materials. A variety of low-k spin on dielectric precursor materials are commercially available from a number of different vendors and are sold for the purpose of forming dielectric films in microelectronic devices. Representative examples of such products are available under the trade designations FLARE from Honeywell, Inc., SILK from Dow Chemical Co., VALOX from Schumacher, HOSP from Honeywell, Inc., and HSQ from Dow Corning Company. The FLARE and SILK materials are organic, being poly(arylene) ethers and aromatic, respectively. The HOSP material is inorganic-organic, being a methyl-substituted silsesquioxane. The HSQ material is inorganic, being a hydrogen silsesquioxane. Each of these materials requires unique processing steps for successful integration with multilevel aluminum and/or copper in Dual Damascene processing, although each generally is thermally cured at temperatures in the range from about 350° C. to about 450° C.

Dielectric precursor materials that form porous dielectric films (preferably ultra low-k and extreme low-k films) upon curing are also known. Generally, these materials include not only a curable dielectric precursor but also one or more relatively volatile components (referred to as "porogens"). These porogens tend to outgas during curing, contributing to the film porosity. Representative examples of such materials are known the respective trade designations NAUTILUS™ from the Dow Chemical Co., POROUS FLARE™ from Honeywell, Inc., POLY ELK™ and MONO ELK™ from Schumacher (Carlsbad, Calif.), LKD™ from JSR Corp., ISP™ from Catalysts and Chemicals, Ltd., Japan, and HSG™ from Hitachi Chemical Co., Ltd.

The manner in which a low-k spin on dielectric material is cured has a significant impact upon the quality of the resultant dielectric film. If curing is carried out carelessly, the film quality will suffer. In some instances, the film quality may be too poor to use as a blanket film and/or may not be able to withstand aluminum or copper integration processes. Factors affecting the cure include how the time, temperature, and processing environment are controlled during the cure process.

Conventionally, the coating and baking steps have been carried out in an integrated fashion in the same tool. However, curing typically has been accomplished by heating a batch of coated microelectronic substrates in a stand-alone furnace. Furnaces have been favored because conventional wisdom has the view that heated platen curing cannot produce dielectric films of the quality demanded by the microelectronic industry.

Yet, furnace processing is not the optimum approach from the perspective of the present inventors. Furnace curing tends to be a batch process in which as many as 30 to 100 wafers or more are cured at the same time, yet manufacturers desire single wafer processing to help ensure that each and every in-process wafer is processed under the same conditions. Single wafer processing is also desirable in the event that a process error occurs, because only a single substrate is at risk. In contrast, if a process error occurs during a furnace cure, the entire batch of substrates could be ruined. Given that a single in-process 300 mm wafer can be worth up to $1 million or more, minimizing process risk is an important concern.

In the course of developing the present invention, we also have observed that furnace processing inevitably leads to some nonuniformity and quality problems when making dielectric films. These nonuniformity and quality problems occur, in our view, at least in part because the time period between the bake and cure steps varies too much from substrate to substrate. Generally, those substrates that are baked earlier must wait until later substrates are baked before the entire batch is submitted to the furnace. Indeed, the time between the bake and cure has been inadequately controlled in conventional processes. Other interstation and intrastation time periods also have not been adequately controlled. Examples from conventional processes are the delay between the coat and bake steps as well as the delay between the curing step and the subsequent cooling step. We have discovered that these kinds of time variations can adversely affect film quality and uniformity from lot to lot, and even from substrate to substrate. Additionally, unlike compact, space efficient heated platens, furnaces tend to be rather large, standalone units that occupy valuable cleanroom floorspace.

Accordingly, there remains a strong need for improved ways to manufacture lower k dielectric films, particularly by using a single wafer processing approach to minimize the risk that process deviations will adversely affect more than one wafer. There also remains a desire to effectively use heated platen curing of low-k spin on dielectric materials.

SUMMARY OF THE INVENTION

The present invention provides improved, single wafer processing methods and systems for manufacturing films having low-k properties and low indices of refraction. Low-k spin on dielectric films of the present invention are also characterized by exceptional levels of uniformity, thermal stability, and mechanical properties. Importantly, these characteristics are achieved with high throughput, e.g., up to about 100 substrates per hour per 64 ft$^2$ of cleanroom floor space. Additionally, both 200 mm and 300 mm wafers can be processed in the same tool in preferred embodiments.

The present invention is based upon several innovations that singly and in combination help to provide these advantages. Firstly, it has been found that controlling the time periods between one or more of coating, baking, curing, and/or cooling steps can greatly enhance the throughput, uniformity, and quality of low-k dielectric films. Such uniformity allows substrates to be sequentially processed, parallel processed, or custom processed on demand using one or more process recipes with the confidence that films made in accordance with a particular recipe will be substantially identical to each other with little if any variation in process signature imparted to the films.

Additionally, low-k spin on dielectric quality and uniformity also are greatly enhanced by integrating the coating, baking, curing, and cooling functions into a single, integrated processing system. Such integration makes it possible to control the consistency and timing of every process step carried out in the course of forming dielectric films. A particular process recipe may be carried out from substrate to substrate or lot to lot with very little detectable variation as compared to conventional furnace processing.

Another feature of the present invention that helps to provide high quality dielectric films is an innovative processing station in which both curing and post-cure, in situ cooling take place. This integration of curing and cooling into the same process station virtually eliminates any kind of variation, including time variation, in the curing and cooling process. This is quite advantageous given that the curing step of dielectric film formation tends to be the most important step in the process. The integration of curing and cooling into a single process station also allows oxygen exposure to be accurately controlled at all times when the low-k spin on dielectric film is hot enough to be susceptible to thermal oxidation damage. In contrast to circumstances when a robot handles a very hot device bearing a dielectric film, in situ cooling also minimizes the robot's signature imparted to the cooled device when the device is removed from the station by the robot.

The present invention also involves an innovative architecture for the integrated curing/in situ cooling station that allows a simple heated platen, instead of a furnace, to be used in production for thermal curing. Because a heated platen is relatively compact, unlike a furnace, the ability to use a heated platen allows the station to be integrated into the same cluster tool as the coating and baking stations. This, in turn, further facilitates forming dielectric films with consistency with very little variation in individual process steps from substrate to substrate and lot to lot.

Many features of the innovative architecture help to make heated platen curing of low-k spin on dielectric materials a reality for production and/or research and development purposes. These innovative features include but are not limited to the following:

(a) an innovative lid design with multiple plenums to allow gas flow dynamics in the chamber to be carefully controlled;

(b) a side door design to minimize exposure to the ambient during loading and unloading of in-process microelectronic substrates;

(c) a hollow base supporting the heated platen to help thermally isolate the heated platen from its housing;

(d) a double-walled housing to enhance thermal isolation of the heated platen and processing chamber from the ambient;

(e) a cooled seal between the heated platen utility conduit and the housing to allow polymeric seals to be used that might otherwise be damaged by the high temperatures encountered in spin on dielectric curing;

(f) the capability for controlling the oxygen content in the process chamber during any desired portion of the curing and cooling stages of operation;

(g) the capability to establish a vacuum in the process chamber when handling materials such as porous spin on dielectric materials; and (h) the capability to cool the device in situ with a gas.

In one aspect, the present invention relates to a method of forming a cured, dielectric composition on a substrate, comprising the steps of:

(a) coating a composition comprising a thermally curable, dielectric precursor onto at least a portion of the substrate;

(b) causing the coated substrate to be positioned in a process chamber;

(c) while the coated substrate is positioned in the process chamber:
 (i) thermally curing the dielectric precursor to form the cured dielectric composition; and
 (ii) causing a gas to coolingly contact the cured dielectric composition; and (d) after said gas coolingly contacts the cured dielectric composition, removing the coated substrate from the process chamber.

In another aspect, the present invention relates to a method of forming dielectric compositions on a plurality of substrates, comprising the steps of:

(a) coating a composition comprising a curable dielectric precursor onto a first substrate;

(b) causing the coated substrate to be prebaked, said prebaking being initiated after a first time interval from the end of the coating step;

(c) causing the coated substrate to be thermally cured, said thermal curing being initiated after a second time interval from the end of the pre-baking step;

(d) causing the thermally cured substrate to be cooled, said cooling being initiated after a third time interval from the end of the thermal curing step; and (e) repeating steps (a) through (d) for at least one additional substrate, wherein the respective second time intervals for each of the first coated substrate and the at least one additional coated substrate are substantially the same.

In another aspect, the present invention relates to a method of forming a cured, dielectric composition on a substrate. A composition comprising a thermally curable, dielectric precursor and an amount of solvent such that the composition has a coatable viscosity is coated onto at least a portion of the substrate. The coated substrate is pre-baked at a first, relatively low temperature profile under conditions such that at least a portion of the coated dielectric precursor is uncured and the coated composition comprises a residual amount of solvent. The dielectric precursor is thermally cured at a second, relatively high temperature profile under conditions such that at least substantially all of the dielectric precursor is cured to form the dielectric composition. The cured dielectric composition is then cooled.

In another aspect, the present invention relates to a method of forming a cured, dielectric composition on a substrate. A composition comprising a thermally curable, dielectric precursor is coated onto at least a portion of the substrate. The coated substrate is caused to be positioned in a process chamber. While coated substrate is caused is positioned in the process chamber, the dielectric precursor is thermally cured to form the cured dielectric composition, wherein at least a portion of the thermal curing occurs under anaerobic conditions; and a gas is caused to coolingly contact the cured dielectric composition. After the gas coolingly contacts the cured dielectric composition, the coated substrate is removed from the process chamber.

In another aspect, the present invention relates to a method of forming respective dielectric compositions on a plurality of substrates, comprising the steps of:

(a) causing a first composition comprising a first dielectric precursor to be coated onto a first substrate;

(b) causing the coated, first substrate to be positioned in a processing chamber;

(c) while the first substrate is positioned in the processing chamber:

(i) causing the first substrate to be in thermal contact with a heat source under conditions effective to thermally cure the first, coated substrate; and (ii) causing a gas to coolingly contact the thermally cured, first substrate; and (d) repeating steps (a) through (c) for a second substrate.

In another aspect, the present invention provides a method of forming respective dielectric compositions on a plurality of substrates, comprising the steps of:

(a) providing first and second groups of substrates, each of said groups comprising at least one substrate to be processed;

(b) in accordance with a first process recipe:
causing a first composition comprising a first dielectric precursor to be coated onto each substrate in the first substrate group;
causing each of the coated, substrates of the first group to be positioned in a processing chamber;
while each of the substrates of the first group is positioned in the processing chamber; causing each such coated substrate of the first group to be in thermal contact with a heat source under conditions effective to thermally cure such coated substrate; and causing a gas to coolingly contact each of the thermally cured, first substrates; and (c) in accordance with a second process recipe different than the first process recipe, repeating step (b) for each of the substrates in the second group.

In another aspect, the present invention relates to an apparatus for is thermally processing a microelectronic device precursor. The apparatus includes a process chamber in which the precursor is positioned during processing. A heat is source thermally coupled to the process chamber in a manner such that the precursor may be heated during processing. A source of a cooling gas is in fluid communication with the process chamber such that the cooling gas may be caused to coolingly contact the precursor during processing. A control system controls the heat source and source of cooling gas in order to subject the precursor to a desired thermal processing profile involving at least one heating step and at least one cooling step during processing.

In another aspect, the present invention provides a cluster tool, comprising at least one combination heat/cool process station. The station includes a process chamber in which the precursor is positioned during processing. A heat source is thermally coupled to the process chamber in a manner such that the precursor may be heated during processing. A source of a cooling gas is in fluid communication with the process chamber such that the cooling gas may be caused to coolingly contact the precursor during processing.

BRIEF DESCRIPTION OF THE DRAWINGS

The above-mentioned and other advantages of the present invention, and the manner of attaining them, will become more apparent and the invention itself will be better understood by reference to the following description of the preferred embodiments of the invention taken in conjunction with the accompanying drawings, wherein.

DETAILED DESCRIPTION OF PRESENTLY PREFERRED EMBODIMENTS

Figure 1:
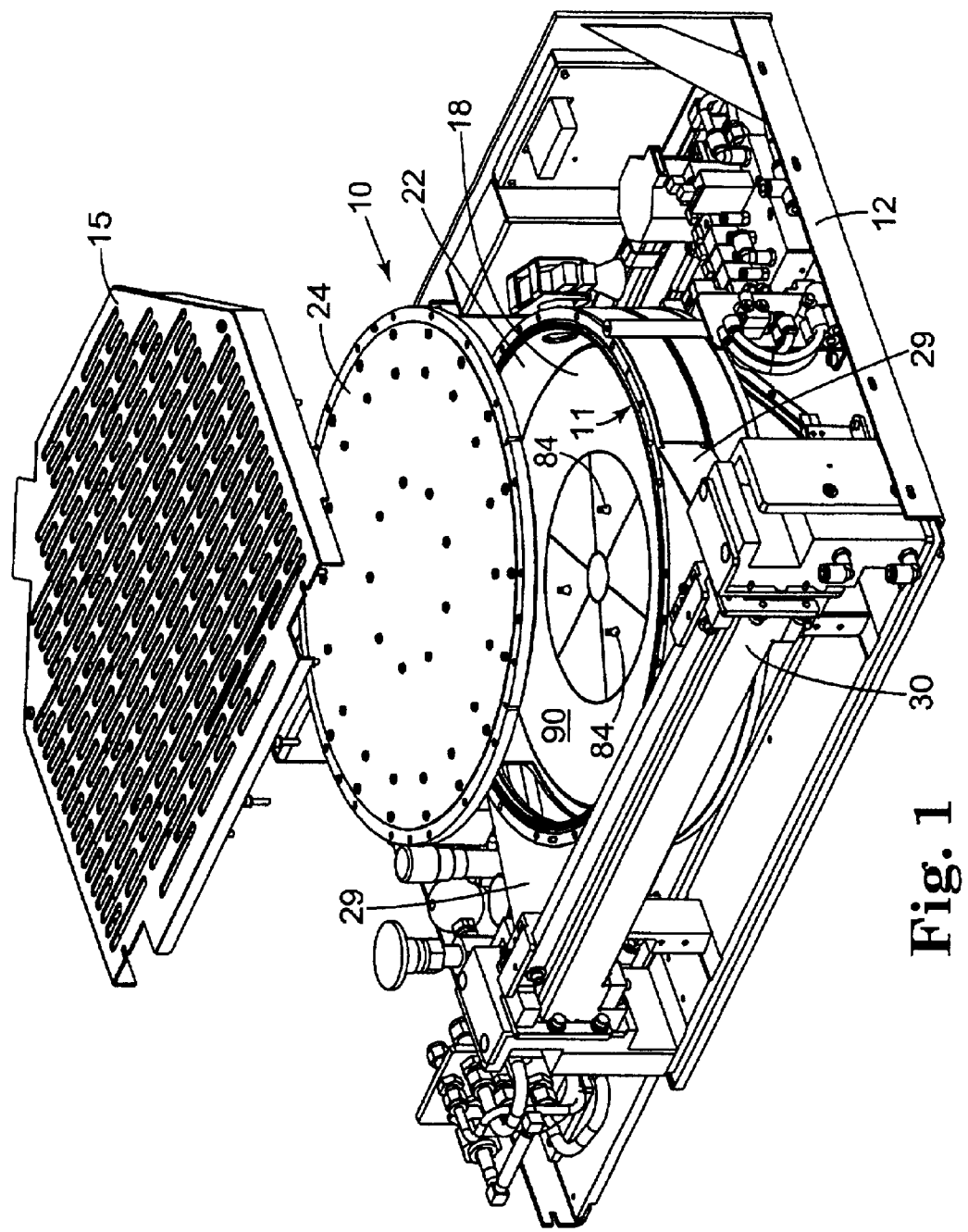
FIG. 1 is a partially exploded view in perspective of an integrated curing and in situ cooling apparatus of the present invention.
Figure 2:
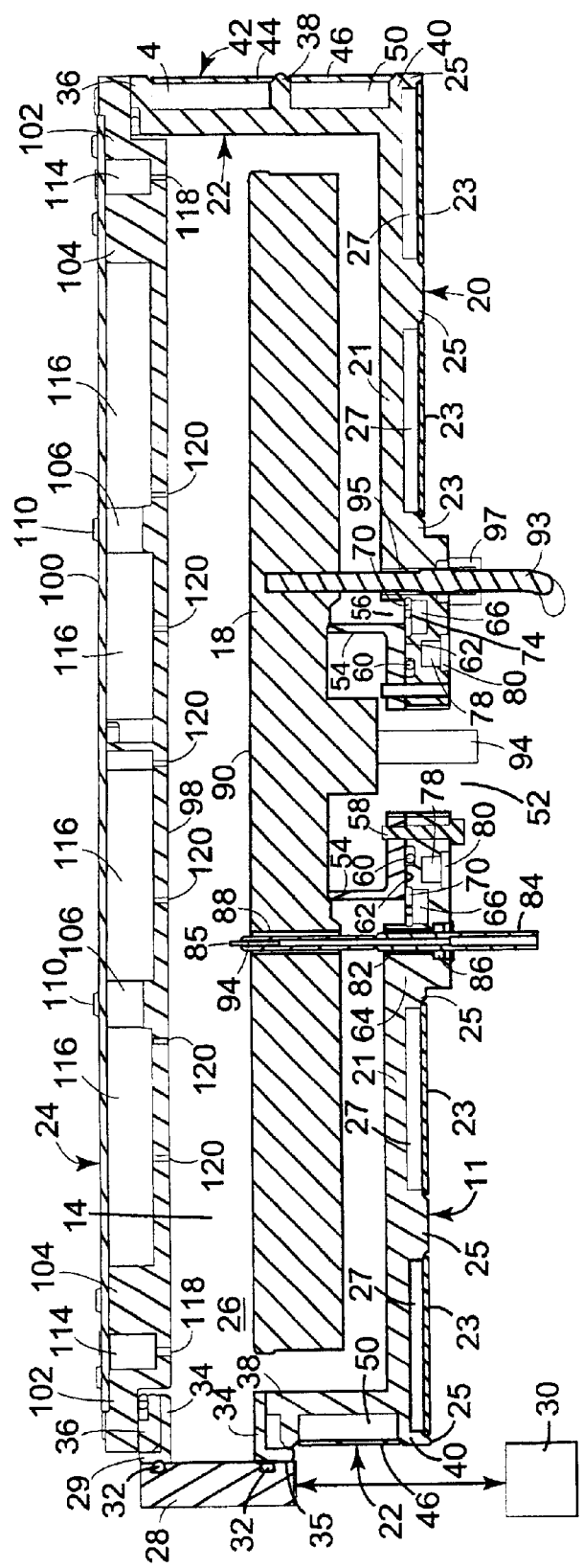
FIG. 2 is a cross-sectional view of the processing chamber of the apparatus shown in FIG. 1.
Figure 3:
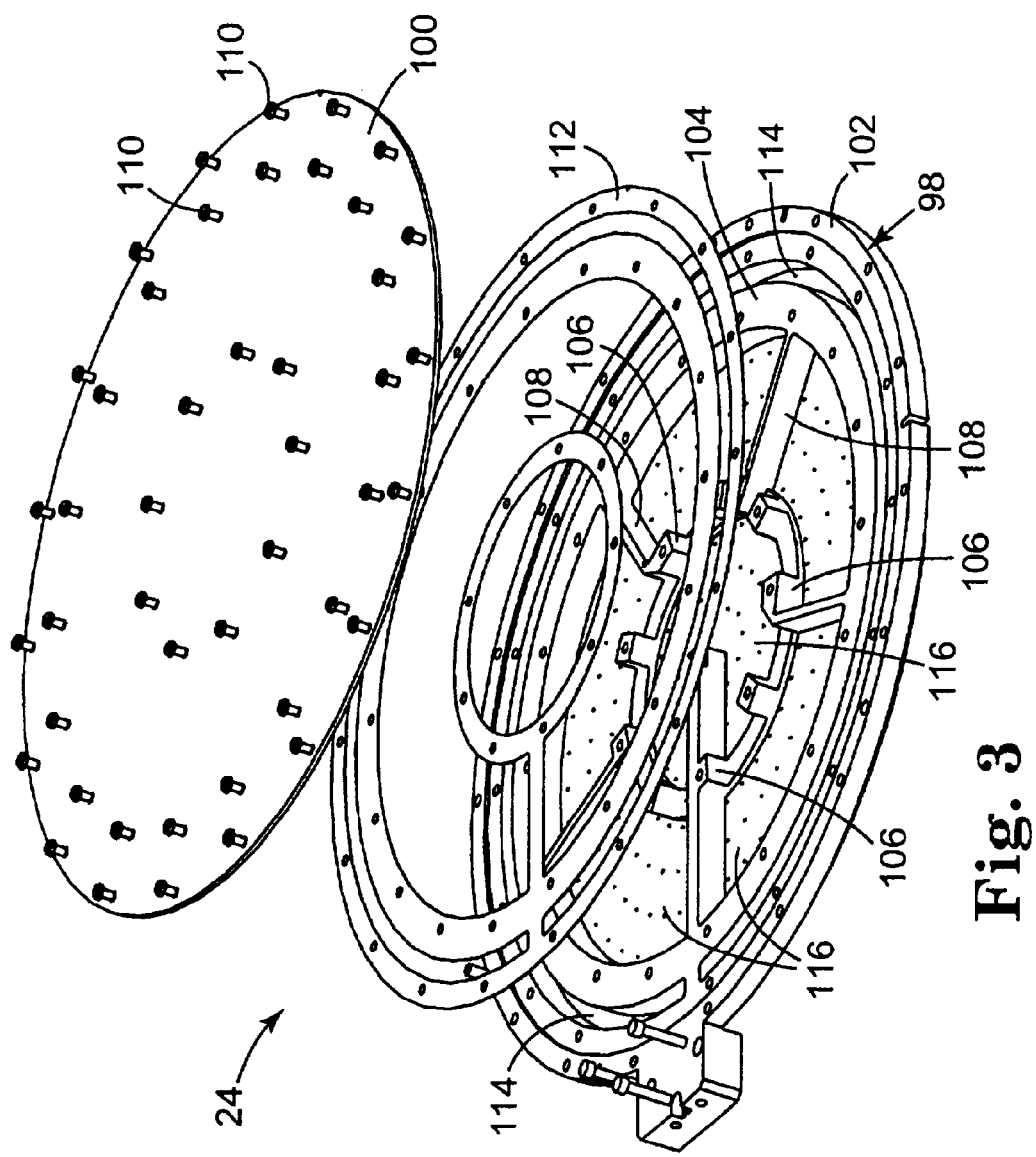
FIG. 3 is an exploded perspective view of the lid used in the apparatus of FIG. 1.

The principles of the present invention are advantageously practiced in connection with innovative processing stations in which low-k spin on dielectric materials may be both cured and then cooled in situ with a gas. Representative embodiments of such processing stations are described in Assignee's copending U.S. patent application titled "Thermal Processing Chamber for Heating and Cooling Wafer-like Objects", having U.S. Ser. No. 09/351,586, filed Jul. 12, 1999, in the names of Womack et al., the entirety of which is incorporated herein by reference. Another particularly preferred embodiment of such a processing station is identified by the trade designation "INSTACURE" and is commercially available as a modular component of the CALYPSO™ cluster tool from FSI International, Inc., Fremont, Calif.

The INSTACURE processing station is generally identical to the processing stations described in Assignee's copending application identified above with five general exceptions. First, the chamber and bakeplate of the INSTACURE processing station are sized to handle devices having a range of sizes, including both 200 mm and 300 mm semiconductor wafers. Second, the bakeplate included in the INSTACURE processing station includes separately controllable, inner and outer heating zones. Third, the lid design of the INSTACURE processing station is modified to introduce process gas(es) into the processing chamber through a showerhead design including a plurality of gas ports of inner and outer lid plenums. Fourth, the cooling and exhaust structure at the base of the bakeplate support members of the INSTACURE processing station is more compact and effective. Fifth, the bottom of the housing of the INSTACURE processing station is double walled to further improve the thermal insulation properties of the housing.

These five modifications are illustrated in FIGS. 1 through 4 where a representative embodiment of the modular "INSTACURE" processing station 10 is shown. To the extent that the components and construction of processing station 10 is similar to that of the thermal processing station shown in FIGS. 1 through 6 of Assignee's co-pending application identified above, their description and functionality will be identified but not described in detail again herein. However, the following description will include a more detailed explanation of the five differences noted herein as well as a detailed explanation of a preferred mode of operation. It is further understood that any of such differences may be incorporated into a processing station of the present invention independently or in any combination with one another.

With reference to FIGS. 1 through 4, an apparatus is illustrated including processing station 10 supported upon support plate 12 that facilitates modular mounting of station 10 into a modular cabinet of the CALYPSO™ cluster tool. Although advantageously used as a station is such cluster tool, station 10 may be provided as a stand-alone system wherein the station 10 and optionally support plate 12 are supported and encased in a suitable housing (not shown). Protective heat shield 15 fits over station 10 to help prevent an operator from accidentally touching station 10 when station 10 is hot.

Station 10 is shown as being cylindrical to accommodate circular semiconductor wafers, but need not be. Preferably, station 10 comprises housing 11 formed from a double-panel bottom wall 20, a double-panel cylindrical side wall 22, and a double-panel lid 24. The preferred double panel structure of these housing components helps to thermally isolate processing chamber 14 from the ambient.

The components of station 10 may be formed from any suitable temperature-resistant material including metals, ceramics, combinations of these, and the like. Preferably, components of station 10 are formed from metal materials, such as aluminum, aluminum alloys, stainless steel, combinations thereof, and the like. It is further preferable that each of the components to be welded to one another be of similar metals to facilitate such welding. The result is a thermally and mechanically robust structure. Of course, for other applications, other materials may be suitable and other connection techniques may be utilized. For example, polymeric materials may be usable and adhesives may connect the components for processes carried out at sufficiently low processing temperatures.

A transfer slot 26 is provided through a portion of side wall 22 so as to provide access to and from processing chamber 14. Preferably, the transfer slot 26 is sized and shaped to accommodate a robotic mechanism (not shown) that is usable for loading and unloading substrate (not shown) from processing chamber 14. However, the transfer slot preferably is not too much larger than is needed for such access so as to prevent excessive exposure to the ambient when transfer slot 26 is open. For example, it is often desirable to provide a controlled, anaerobic environment within processing chamber 14. In this circumstance, a minimized transfer slot size is beneficial in preventing unwanted oxygen in the ambient from entering the internal processing chamber 14.

The transfer slot 26 is also preferably sealingly closable by a chamber door 28 that is moveable through a range of motion including opened and closed positions by a door closure mechanism 30. Preferably, door 28 is biased towards a closed position in the absence of an actuating, opening force. Chamber door 28 opens towards the outside of station 10 and, when closed, seats against housing adapter 29 that provides a suitable surface to closingly engage door 28. Housing adapter 29 may be fabricated in any conventional way without compromising the sealable nature of the internal processing chamber 14. Housing adapter 29 is shown as a separate part that is attached to the exterior of station 10, but could be integral with housing 11 of station 10 if desired.

Door closure mechanism 30 controls the opening and closing of door 28. The door closure mechanism 30 can comprise any known or developed mechanism for opening and closing the chamber door 28, but preferably such door closure mechanism 30 not only moves the chamber door 28 between opened and closed positions (i.e., to and from a position in front of the transfer slot 26) but also is capable of urging the door 28 toward chamber side wall 22 when the chamber door 28 is positioned in a closed position in front of the transfer slot 26. With the addition of a seal 32 provided within a perimetric groove on the inside surface 33 of the chamber door 28, such a door closure mechanism 30 assures a proper sealing of the internal processing chamber 14.

To further facilitate this sealing arrangement, a perimetric flange 34 is also preferably secured to side wall 22 around the transfer slot 26 to provide an outer perimetric sealing surface 35 that seal 32 engages in the closed position of the chamber door 28. Alternatively, other closure mechanisms that include pneumatic, hydraulic, mechanical and electro-mechanical drive substrates may instead by used. It is preferable, however, that the chamber door 28 be movable not only between positions opening and closing the transfer slot 26, but also movable toward and away from the side wall 22 to provide a good sealing arrangement. Such movements can be imparted by one or more independent drive mechanisms.

In accordance with one aspect of the present invention, the side wall 22 preferably has a multi-wall structure (i.e.

having two or more spaced walls). In accordance with the embodiment illustrated in FIGS. 1 through 4, for example, the side wall 22 includes a radially extending annular top portion 36, a radially extending annular middle portion 38, and a radially extending annular bottom portion 40. An outer wall 42 is further provided and connected to the annular top, middle and bottom portions 36, 38 and 40, respectively, to define the double-wall structure. The outer wall 42 may comprise an upper wall portion 44 and a lower wall portion 46 that may be fabricated independently or as a single, integrated part. In this regard, the middle annular portion 38 may extend all the way around the side wall 22, or may extend as a plurality of discrete, projecting posts or the like arranged about the side wall 22. Alternatively, the middle annular portion 38 may be eliminated, but its presence is preferred to help provide mechanical structural strength to the double wall structure.

In any case, the double wall structure defines one or more internal wall cavities that, as illustrated, are divided into an upper wall cavity 48 and a lower wall cavity 50. The upper wall cavity 48 does not extend completely around the internal processing chamber 14 as the perimetric flange 34 defining the transfer slot 26 blocks it at one portion of the side wall 22. The lower wall cavity 50 preferably extends completely about the internal processing chamber 14. The outer wall 42 is preferably connected with the inner wall 22, and the perimetric flange 34 is preferably connected with the side wall 22 by welding, although any suitable attachment technique may be used.

The chamber's bottom wall 20 is preferably fabricated intregally with the side wall 22. However, it may otherwise be formed separately and structurally secured to the side wall 22 by any conventional means such as by welding. In this embodiment, the bottom wall 20 comprises a double wall structure including inner wall member 21 and outer panels 23 that are attached to ribs 25 so as to be spaced apart from inner wall member 21. Cavities 27 are defined by the spaced apart structure. Bottom wall 20 includes an opening 52, preferably centrally located, to facilitate the passage of components to and from the heated platen 18 through heated platen post 94.

Heated platen 18 is positioned in processing chamber 14 of station 10 and generates heat that is transferred to an in-process microelectronic substrate (not shown) when the substrate and the heated platen are in thermal contact with each other. As described below in connection with a discussion of a preferred mode of operation of station 10, thermal contact does not necessarily mean that the substrate and surface 90 are in direct physical contact, and indeed preferably means that there is a small gap between surface 90 and the substrate across which thermal heat transfer may still occur. For steady state operation, heated platen 18 is typically maintained at a temperature effective to cure the particular type of spin on dielectric material being used. This temperature typically is in the range of from about 350° C. to about 450° C.

Figure 4:
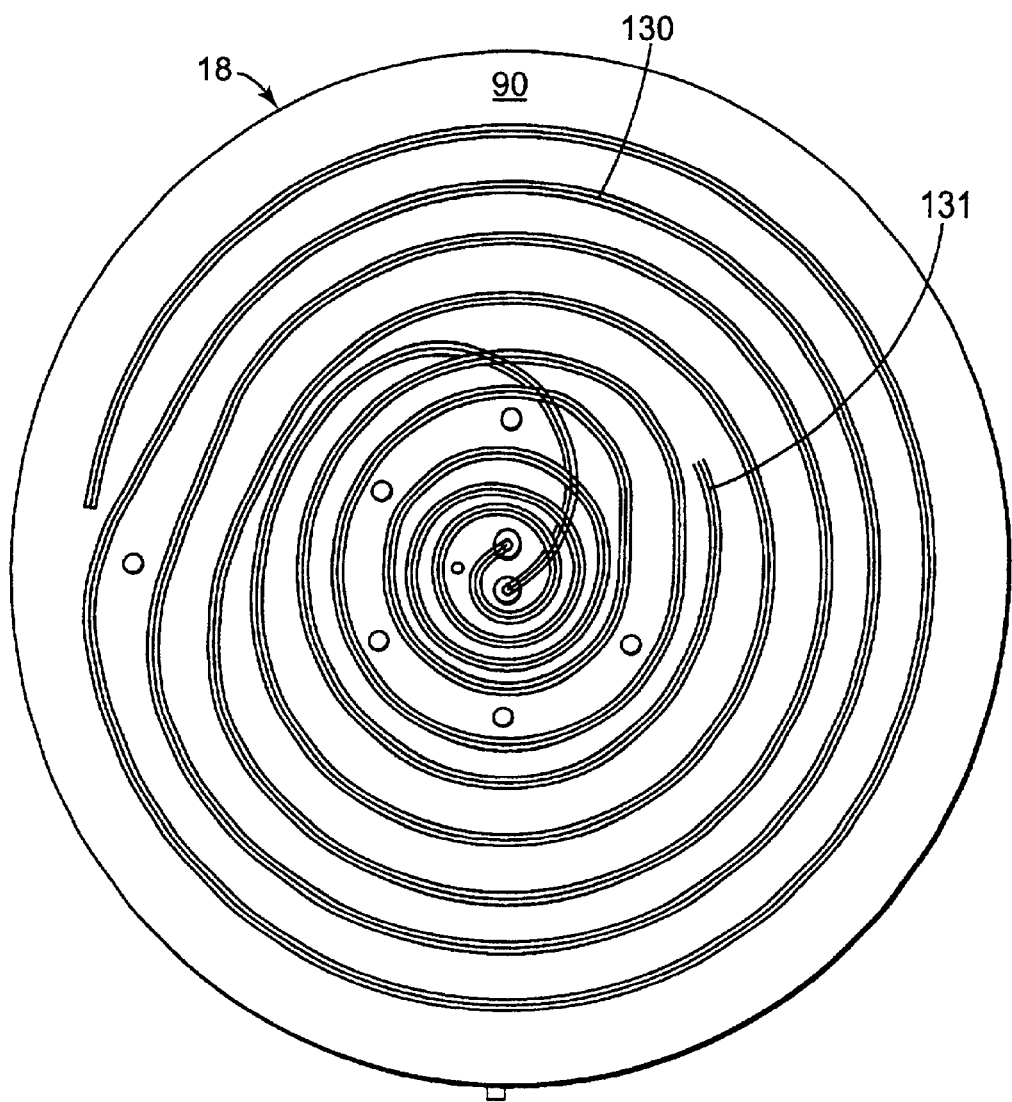
FIG. 4 is a schematic plan view of the heated platen and its heating element that are used in the apparatus of FIG. 1.

Heated platen 18 preferably comprises a heating mechanism for providing heat transfer to the substrate. A preferred heating mechanism is shown in FIG. 4. The preferred heating mechanism includes a pair of spiral, electroresistive heating elements 130 and 131 that are embedded in hotplate 18. Elements 130 and 131 each uniformly traverse respective inner and outer heating zones to allow the temperature in each zone to be independently controlled. The use of multiple heating zones in this fashion makes it easier to establish and maintain a uniform temperature across the entirety of surface 90.

Other heating mechanisms may be used if desired. For example, assignee's copending application identified above shows a heated platen in which a single heating cable is embedded in the heated platen in a uniform spiral. Instead of heating cables, film heaters may also be used, such as the type including a film layer or mica layer having a heater circuit printed on a surface thereof. Such a film heater could be formed on surface 90. As yet another alternative, one or more heater circuits may be printed directly onto the top, within via printing onto subsequently laminated layers, or onto bottom surface of heated platen 18. As yet another alternative, the heating substrate disclosed in copending U.S. patent application Ser. No. 09/035,628, filed Mar. 5, 1998, and owned by the assignee of the subject application, could also be utilized. As still another option, heated platen 18 may include one or more internal passages through which a hot process fluid flows in order to provide the desired heat output.

Heated platen 18 is supported, at least in part, upon hollow pedestal base 54. Hollow pedestal base 54 sits within an annular recess 56 formed within the bottom wall 20 on the internal chamber side. Conventional bolts 58 can secure the pedestal base 54 to the bottom wall 20. The hollow character of pedestal base 54 helps to thermally isolate heated platen 18 from bottom wall 20. To effectively seal the internal processing chamber 14, a seal ring 60 is provided between a lower surface 62 of the pedestal base 54 and the bottom of the annular recess 56 so that as the pedestal base 54 is mounted via the bolts 58, a good sealing relationship is established. To facilitate this construction, the central portion 64 of the bottom wall 20 is preferably made thicker.

Also in the thicker central portion 64 of bottom wall 20, an exhaust passage 66 is positioned and provides a pathway for removal of process fluids from processing chamber 14. Exhaust channel 66 is preferably annular as provided by an annual recess of the central portion 64 that is open to the internal chamber side thereof. One or more passages (not shown) are also provided extending through the remainder of the thickness of the central portion 64 so that exhaust fluids can be withdrawn from the exhaust channel 66 to the outside of station 10 by conventional tubing and fittings or the like. To modulate the size of the inlet passages leading into the exhaust channel 66 from chamber 14, a removable exhaust plate 70 is provided having an arrangement of orifices 72 arranged along the exhaust plate 70 in any desired pattern and total open area. Thus, by fluidly connecting the exhaust channel 66 to an exhaust system, e.g., a vacuum, fluid can be withdrawn from the processing chamber 14 through the orifices 72 into the exhaust channel 66 and out of the station 10. By using a removable exhaust plate 70, the size, pattern, an arrangement of the orifices 72 can easily be varied depending on any particular application of the station 10 by merely replacing the exhaust plate 70 with another having orifices of a different size and/or pattern. The exhaust plate 70 is preferably fitted within a stepped portion of the annular recess 68 and is preferably secured in place by overlapping portions of pedestal base 54.

Also provided within the central portion 64 of the bottom wall 20, is a cooling channel 78 for circulating a cooling fluid, e.g., a gas or liquid, to help cool seal 60. The cooling channel 78 preferably comprises a recess formed in the central portion 64 of bottom wall 20. The recess is open to the outside of the bottom wall 20. The cooling channel 78 preferably substantially forms a circular channel (as viewed in a plan view) that is thermally proximal to seal ring 60, but preferably stops short of defining a full circle so that one end of the cooling channel 78 can be utilized as an inlet and its other end can be used as an outlet. To close the cooling channel 78 from the outside, a plate 80 is secured to the central portion 64 of the bottom wall 20 so as to sealingly cover the cooling channel 78 and to provide inlet and outlet passages (not shown) by which the cooling channel 78 can be appropriately fluidly connected with input and outlet lines of a cooling system in any conventional way.

Also provided through the central portion 64 of the bottom wall 20 are a number of (preferably three) passages 82 (only one shown in FIG. 2) that accommodate reciprocal movement of lift pin mechanisms 84. In addition to facilitating the reciprocal movement of the lift pin mechanisms 84, the passages 82 must permit this movement while effectively sealing the internal processing chamber 14 from the ambient. To do this, seal rings 86 are preferably installed within a recess provided from the outside of the central portion 64 around the passages 82 for providing sealing sliding engagement with the lift pin mechanisms 84. Such seal rings 86 may be secured in place by mounting plates retained, in turn, by a plurality of fasteners or any other conventional means.

The passages 82, and thus the lift pin mechanisms 84, are preferably arranged concentrically (but need not be) about the opening 52. Lift pins extend through passages 88 (only one shown in FIG. 2) that, in turn, extend entirely through the thickness of heated platen 18. Heated platen 18, which is directly supported by the pedestal base 54, provides a support surface 90 that can be positioned in thermal transfer contact with an in-process microelectronic substrate (not shown). The lift pin mechanisms 84 are movable from a position where their tips 85 place the substrate into thermal transfer contact.

Lift pin mechanisms 84 also are movable as driven by a reciprocal drive mechanism (not shown) to positions where their tips 85 are located well above the surface 90 so as to be able to support the in-process substrate above and out of thermal contact with heated platen 18. The degree to which lift pin 84 movement must physically separate the substrate from surface 90 is dependent on the cooling needs and fluid flow characteristics of the internal processing chamber 14. In short, lift pin mechanisms 84 can be raised to cause an in-process substrate to be physically and thermally separated from heated platen 18 and can be lowered to bring the substrate into thermal contact with surface 90.

To accomplish movement of lift pin mechanisms 84 simultaneously, each lift pin 84 is preferably connected to a common element, such as a plate or ring (not shown) so that a drive mechanism 92 can actuate just the single element to simultaneously raise or lower all lift pin mechanisms 84 together. The drive mechanism 92 can comprise any known or developed mechanism capable of linear movement, such as a lead screw mechanism driven by a stepper motor. It is further preferable that each lift pin 84 further include an internal passage 94 that can be conventionally connected with a vacuum line or system so as to draw vacuum through tips 85 for holding the substrate against the tips 85.

Temperature sensing mechanism 93 is coupled to heated platen 18 to monitor heated platen temperature. Temperature sensing substrate enters chamber 14 through aperture 95 and is held in place by collar 97. O-ring 99 helps to provide a good seal at this opening. Temperature sensing mechanism 93 may be any conventional substrate such as an RTD or thermocouple. Temperature sensing mechanism 93 is connected to a control circuit (not shown) so as to allow heated platen temperature to be monitored and controlled in a conventional manner. The control mechanism itself does not form a particular part of the subject application and can be provided in any known or developed manner consistent with the basic operation of controlling the heat generated based upon temperature sensing information.

Lid 24 seals the top of station 10. Lid 24 preferably is formed from a double panel structure in which generally circular panel 98 is attached in spaced apart fashion to cover plate 100. The spacing between panel 98 and cover plate 100 is maintained by peripheral wall flange 102 and inner, annular wall flange 104 positioned generally concentrically and radially inward from wall flange 102. To help strengthen lid 24, cover plate 100 is further supported upon a plurality of spaced apart posts 106. Radial reinforcing ribs 108 extending between posts 106 and wall flange 104 further help to strengthen lid 24. Cover plate 100 is secured in place using a plurality of fasteners 110. Gasket 112 (not shown in FIG. 2) helps to form a good seal between cover plate 100 and the other portions of lid 24 to which it is attached.

The structure of lid 24 thus defines an outer, annular plenum 114 and an inner plenum 116. Outer plenum 114 is in fluid communication with processing chamber 14 through a plurality of ports 118 distributed uniformly around annular portion 122 of panel 98 in a preferred annular array. Inner plenum 116 is in fluid communication with processing chamber through a plurality of ports 120 distributed about inner portion 124 of panel 98. Each of plenums 114 and 116 independently provides a pathway by which process gases can be independently or collectively introduced into process chamber 14 in a controlled, showerhead fashion. To this end, one or more sources (not shown) of process gases may be independently coupled to inner and outer plenums 114 and 116 via conventional is plumbing.

Advantageously, the combination curing/in situ cooling station 10 shown in FIGS. 1 through 4 may be used to first cure films containing a curable dielectric precursor to form a dielectric film, and secondly to cool the cured film in situ with a gas before the substrate bearing the cured film is removed from the station 10. In situ cooling of the film is important to minimize thermo-oxidative decomposition of the film. A preferred mode of operation to accomplish curing and in situ cooling involves a loading stage, a gas purging stage, a curing stage, a cooling stage, and an unloading stage. In the loading stage, door 28 is opened to allow a substrate to be placed into process chamber 14. At this time, an annular curtain of one or more non-oxidizing gas(es) flows downward into chamber 14 through the outer plenum 108 of lid 24 to help isolate process chamber 14 from the ambient. Optionally, one or more non-oxidizing gas(es) may also flow into chamber 14 through inner plenum 110 during the loading stage, but this is not required. The substrate bearing a baked coating containing a dried or substantially dried dielectric precursor is placed onto raised lift pin mechanisms 84, generally positioning the substrate substantially out of thermal contact with heated platen 18. Door 28 is then closed to environmentally seal process chamber 14.

Throughout this and any stage of the operation, the non-oxidizing gas(es) flowing through outer plenum 114 and/or inner plenum 116, as the case may be, preferably is/are independently selected from nitrogen, helium, argon, a forming gas comprising $N_2$ and $H_2$, combinations of these, and the like. Nitrogen presently is preferred. The gas or gases may be supplied at any temperature within a wide range. A representative temperature is from more than about 0° C. to about 300° C., preferably about 15° C. to about 250° C., and more preferably at about ambient temperature, e.g., about 20° C. to 25° C. Throughout the entire curing and in situ cooling operation, each flow of gas(es) through the inner and outer plenums 116 and 114 is supplied independently at a respective flow rate ranging from about 0.5 ft$^3$/hr to 100 ft$^3$/hr. A preferred flow rate for the outer gas flow is 40 ft$^3$/hr, and a preferred flow rate for the inner gas flow is about 50 ft$^3$/hr, or vice-versa.

The next stage of operation is the gas purging stage. In this stage, process chamber 14 is purged with a flow of one or more nonoxidizing gases in order to controllably establish and maintain an anaerobic processing environment with a controlled, reduced amount of oxygen. The ability to control the oxygen level during the curing process is important, because many dielectric precursors as well as the resultant dielectric films are susceptible to thermal oxidation at elevated temperatures in the presence of oxygen. For many dielectric materials, especially dielectric materials containing organic components, thermal oxidation becomes a risk even in ordinary air at temperatures in the range of from about 325° C. to about 375° C., depending upon the particular material. Because dielectric precursors are generally cured at temperatures well above this temperature regime, the substrates bearing these materials are desirably maintained in an anaerobic environment so long as the substrates are hot enough for thermal oxidation to be an undue risk. Accordingly, when the dielectric material being used is organic, the oxygen content is desirably as low as possible. Taking practical considerations into account, the oxygen content during anaerobic processing is preferably up to 200 ppm, more preferably 1 to 200 ppm, most preferably 5 to 20 ppm.

A somewhat higher oxygen level may be desired for other kinds of dielectric materials in order to help ensure that curing proceeds in a preferential direction. For example, inorganic dielectric precursors benefit from having oxygen present in order to help ensure that curing occurs with minimal side reactions. Accordingly, when the dielectric materials being used are inorganic or inorganic-organic, process chamber 14 is purged under conditions effective to establish an anaerobic processing environment containing 100 ppm to 2000 ppm, preferably about 200 ppm oxygen.

In addition to establishing a controlled level of oxygen in chamber 14, a vacuum may be established in processing chamber 14 in this purging stage, if desired, to enhance the dielectric properties of the resultant cured film. Establishing such a vacuum is particularly desirable in those applications in which a porous, dielectric film is to be formed. Some kinds of porous dielectric films are formed from materials that not only include a dielectric precursor, but also include one or more materials ("porogens") that tend to volatilize under the curing conditions and outgas to create porosity during the cure. A vacuum is used to facilitate such outgassing. The level of vacuum to be established will vary depending upon the nature of the dielectric material and is typically specified by the material manufacturer. As suggested guidelines, the capability of establishing a vacuum in the range from about 1 torr up to about ambient would be suitable. A preferred vacuum level presently is about 20 torr.

During the nitrogen purge, a non-oxidizing gas preferably purgingly flows into chamber 14 through inner plenum 116 of lid 24. An optional flow of non-oxidizing gas through outer plenum 114 may also be used, but is not required. With a flow of about 50 ft$^3$/hr through the inner plenum 116, purging occurs for a period of about 10 seconds to about 5 minutes, preferably about 15 to 60 seconds.

After the oxygen content in the processing chamber is at the desired level, the curing stage of the operation stage takes place. Lift pin mechanisms 84 supporting the substrate are lowered to place the substrate into thermal contact with heated platen 18. In the practice of the present invention, thermal contact may involve actual physical contact between the substrate and heated platen 18, but actual physical contact is not required. Effective heating can be achieved by positioning the substrate in close proximity to heated platen 18, e.g., at a distance of 6 mil to 50 mil. Indeed, such a gap is preferred in some applications, because actual physical contact can contaminate the back side of the substrate. As a consequence, the substrate is heated under conditions effective to cure the dielectric precursor and form a cured dielectric film on the substrate. The curing temperature will vary depending upon the type of dielectric precursor being cured. For the commercially available dielectric precursors, the heated platen 18 is typically maintained at a temperature within the range from about 350° C. to about 450° C. The length of time at which the substrate is cured will also vary depending upon the kind of dielectric precursor being cured. Generally, station 10 of the present invention is capable of achieving very rapid curing, and curing periods of no more than ten minutes, preferably 1 to 3 minutes would be sufficient.

After the curing stage is completed, the cooling stage occurs. Because dielectric films are susceptible to thermal oxidation if exposed to the ambient while at elevated temperatures, the substrate is advantageously cooled in situ to a suitably low threshhold temperature before being removed from station 10. This threshhold temperature is generally in the range from 200° C. to about 325° C., preferably about 250° C. Lower temperatures could be used, if desired, but such a practice will increase cycle time. Higher temperatures could also be used if desired, but with an increased risk of subjecting the cured dielectric film to thermal oxidation.

In the practice of the present invention, such in situ cooling is accomplished by raising lift pin mechanism 84 to thermally decouple the substrate from the heated platen 18. In practice, the physical separation between heated platen 18 and the raised substrate is generally about 100 mil to 600 mil, preferably about 530 mil. In situ cooling is then accomplished by causing a flow of gas through inner plenum 116 to coolingly contact the substrate while the substrate remains inside station 10. An optional flow of gas may also enter the chamber through outer plenum 114 if desired, but this is not required. Cooling is relatively rapid and can be completed in about 1 to 2 minutes.

After the substrate is cooled to the desired target temperature, the substrate is removed from station 10 in the unloading stage of the operation. With the cured and cooled substrate supported upon raised lift pin mechanisms 84, a curtain flow of gas through outer plenum 116 is established (if not already flowing) to help form a barrier between chamber 14 and the ambient. An optional flow of gas through inner plenum 116 may be maintained as well, but this is not required. With the curtain flow established, door 28 is opened, and the substrate may be removed from chamber 14 by a suitable handler, e.g., a robot or the like.

Figure 5:
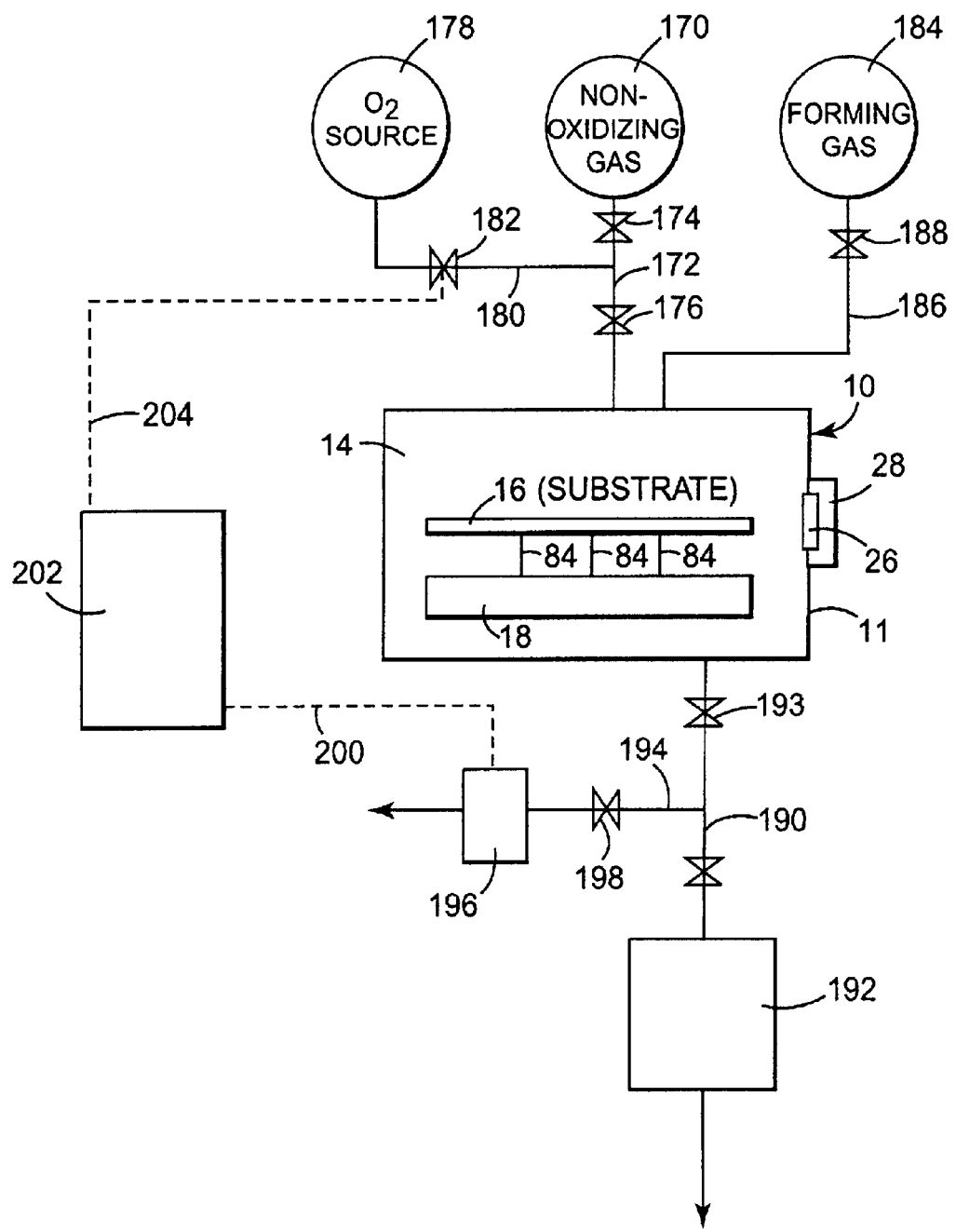
FIG. 5 is a schematic representation showing a system for controlling the level of oxygen during operation of the apparatus of FIG. 1.

FIG. 5 shows one embodiment of an approach of the present invention in which the oxygen level in combination cure/in situ cooling station 10 of FIGS. 1 through 4 is controllable. FIG. 5 shows station 10 in simplified form as including process chamber 14 in which in-process microelectronic substrate 16 is supported upon lift pins 84 above heated platen 18. Door 28 opens and closes to allow loading and unloading to and from process chamber 14. To carry out in situ cooling in accordance with the present invention, source 170 of cooling gas is fluidly coupled to chamber 14 via supply line 172. The flow of cooling gas flowing through line 172 is controlled via valves 174 and 176. Oxygen containing gas (such as ambient air) from source 178 is fluidly coupled to line 172 via line 180. Valve 182 controls the amount of oxygen containing gas combined with cooling gas so that the level of oxygen in cooling gas entering chamber 14 can be controllably maintained at desired processing level(s) during curing and in situ cooling. Valve 176 controls the flow of oxygen containing cooling gas into chamber 14. One or more additional process gases may also be fluidly coupled to chamber 14. For purposes of illustration, a source 184 of conventional forming gas containing nitrogen and hydrogen is fluidly coupled to chamber 14 via supply line 186. Valve 188 controls the flow of the forming gas. Process gases are exhausted from chamber 14 via exhaust line 190. Exhaust line 190 is operationally coupled to vacuum pump 192 to allow chamber 14 to be placed under vacuum if desired. Valve 193 controls the flow of exhaust gases from process chamber 14.

In order to monitor and control oxygen level in process chamber 14, a portion of the exhaust gases is drawn off through line 194 to oxygen sensor 196. Valve 198 controls this flow. Oxygen sensor 196 can be any suitable sensor capable of accurately measuring oxygen levels in a range at least including about 5 ppm to about 500 ppm. A variety of such sensors are commercially available and any could be used. One specific example of an oxygen sensor found to be suitable in the practice of the present invention is commercially available under the trade designation Oxygen Analyzer #60-0329 from Illinois Instruments, Inc.

Oxygen sensor 196 generates an output signal 200 indicative of the oxygen level in the exhaust gases. The output signal 200 is transmitted to controller 202. Using conventional control methodology, controller 202 generates a control signal 204 indicative of the degree to which the oxygen content in the exhaust gases deviates from the desired level. An appropriate control signal 204 is sent to valve 182 to reduce the flow of oxygen containing gas into line 172 if the measured oxygen level is too high or to increase the flow of oxygen containing gas into line 172 if the measured oxygen level is too low.

FIG. 5 illustrates a feedback approach for controlling the oxygen level in process chamber 14. Of course, any other suitable control methodology could be used. For example, feedforward control could be implemented by measuring the oxygen level in the gas entering process chamber 14 and then using the measurement to derive an appropriate control signal to send to valve 182. As another option, oxygen levels in both the inlet and exhaust gases could be monitored as the basis for a combination feedback and feedforward control methodology.

The combination cure/in situ cooling stations of the present invention may advantageously be incorporated into cluster tools in which coating, baking, curing, and cooling all occur in one integrated system. A particularly preferred, integrated cluster tool incorporating the curing and in situ cooling capabilities of the present invention is commercially available from FSI International, Inc., Fremont, Calif., USA, under the trade designation CALYPSO™. This cluster tool is advantageously used to form low-k spin on dielectric films on microelectronic substrates. The cluster tool integrates spin-coating, baking, curing, in situ cooling, and chilling operations in a single platform capable of high volume production. More than one of each kind of station may be included to further increase productivity without increasing footprint. Dielectric films made using this tool tend to have lower refractive indices and dielectric constants as compared to otherwise identical films that are furnace processed.

Due to the integrated curing and in situ cooling capabilities in particular, the need to have a separate furnace on hand for curing is eliminated, further minimizing the total cleanroom floorspace needed to form low-k spin on dielectric films. In short, the tool provides high productivity while also using valuable cleanroom floorspace very efficiently. Throughput of up to about 100 substrates per hour are easily achieved by this tool, which only occupies a footprint of about 64 $ft^2$. The integration of coating, baking, curing, and cooling into one tool not only significantly enhances low-k spin on dielectric film quality and uniformity, but also reduces device contamination. Curing and in situ cooling are preferably accomplished in a single, combination curing/in situ cooling station of the type shown in FIGS. 1 through 4 herein or in Assignee's co-pending application identified above.

The CALYPSO™ cluster tool is extremely versatile in terms of processing capabilities. Substrates may be individually processed, sequentially processed, or parallel processed using the same process recipe or custom process recipes for any one or more of the substrates being processed. The tool can easily handle substrates of different sizes. For example, by merely switching the robot end effector on the centrally located robot and the spin coating shield in the coating station(s), and by then selecting the appropriate process recipe in the PC-based control system, the tool can be converted from 200 mm processing capability to 300 mm processing capability, and vice versa. The need to have separate machines for processing 200 mm and 300 mm wafers, respectively, is thus eliminated. This is still yet another way in which the tool saves valuable cleanroom floorspace. The tool also is capable of forming dielectric films, including porous dielectric films, from a wide range of low-k spin on dielectric precursors including but not limited to the commercially available POLY ELK, LKD, HSG, porous SILK 2, ISP, and porous FLARE, dielectric precursor materials.

The CALYPSO™ cluster tool also prepares lower k dielectric films as compared to conventional furnace-based processes. Dielectric films produced using the principles of the present invention as practiced on this tool also have lower refractive index and show tremendous thickness uniformity from wafer to wafer. For example, when forming dielectric films from the FLARE material, wafer to wafer thickness uniformity of 0.2% or better (one sigma) are easily achieved. In the practice of the present invention, thickness uniformity is determined from 49 thickness data points measured using a NANOMETRICS tool to make the measurements. As compared to otherwise identical furnace-based processes, dielectric films of the present invention also tend to have better thermal stability. The high quality of the dielectric films allows resultant films to be integrated with multilevel aluminum (subtractive metal processing) and/or copper (e.g., dual damascene processing) for ULSI applications.

Figure 6:
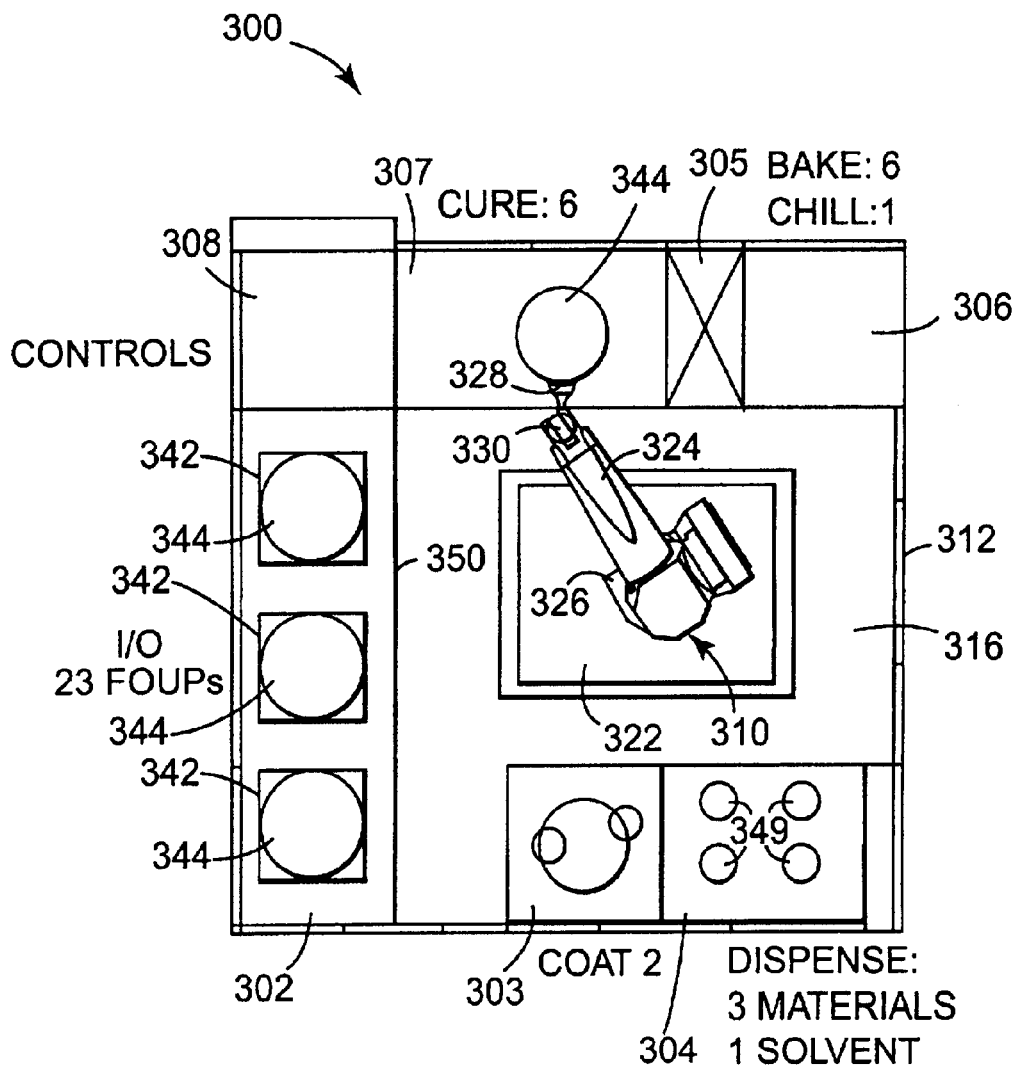
FIG. 6 is a schematic plan view of a tool cluster of the present invention suitable for production.

A representative embodiment of the versatile CALYPSO™ cluster tool 300 is schematically shown in FIG. 6, in which tool 300 is shown in one illustrative production configuration. Cluster tool 300 generally includes a plurality of modules 302, 303, 304, 305, 306, 307, and 308 operationally positioned around central robot 310. Advantageously, each of modules 302, 303, 304, 305, 306, 307, and 308 is a self-contained module complete with frame, skins, electronics, control hardware, and processor and facility connections. The facility connections are independently coupled to a facility platform centrally located below robot 310. The modularity allows individual modules to be easily removed for service, upgrade, replacement, or the like.

Wall 312 optionally includes one or more access ports, e.g., a door or panel or the like, to allow access into cluster tool 300 for service and maintenance. Wall 312 also may include one or more transparent panels to allow visual inspection of the interior region 316 of cluster tool 300.

Robot 310 includes base 322, jointed arm 324 attached to base 322 at joint 326, and end effector 328 releasably attached to distal end 330 of arm 324. End effector 328 releasably grips a wafer 344 being processed. In some embodiments, an end effector to be used on arm 324 is designed to be able to grab and release devices of a particular size or size range. In such embodiments, end effectors are swapped in order to switch from 200 mm processing to 300 mm processing, or vice versa. In other embodiments, a so-called universal end effector may be used that is capable of gripping and releasing objects of various sizes. In such embodiments, the same end effector can be used to handle both 200 mm and 300 mm wafers without the need for swapping the end effector for another one. Advantageously, robot 310 can reach any station in the cluster tool 300. This full, operational range eliminates the need for additional and/or secondary robots, although one or more of such additional robots could be incorporated into cluster tool 300 if desired.

An integrated selection of modular processing stations is arranged within operational reach of robot 310 in the various modules 302, 303, 304, 305, 306, 307, and 308. The kind of stations, the number of each kind of station, and the placement of each kind of station in one or more of modules 302, 303, 304, 305, 306, 307, and 308 will depend upon factors such as the desired throughput, the process recipes to be used, the available utilities, the type of device being fabricated, and the like. One or more stations may be placed in each module, and the stations positioned in a particular module may be the same or different. For purposes of illustration, one suitable arrangement of stations in cluster tool 300 is shown in FIG. 6.

Specifically, one or more input/output (I/O) stations are modularly inserted into module 302. One or more cassettes 342 holding one or more wafers 344 may be loaded into I/O stations 340 through a door (not shown) or pod (not shown). Robot 310 can then access wafers 344 held in cassette 342, typically one wafer at a time, through a door (not shown) on the interior face 350 of cabinet 302. For purposes of illustration, three I/O stations are shown.

One or more spin-coating stations are incorporated into module 303. For production 2 to 3 spin coating stations are preferred. Module 304 may be used to store reservoirs 349 (four reservoirs 349 shown for purposes of illustration) of one or more process chemicals used in the various stations. For example, one reservoir 349 may be used for solvent, and the others may be used to hold dielectric precursor fluids. These reservoirs 349 are fluidly coupled to one or more of the spin-coating stations by suitable plumbing (not shown). One or more bake stations are incorporated into module 306. The bake stations may incorporate not just a bake plate but also an intrastation chill plate to accomplish chilling after a baking operation. A preferred embodiment of module 306 includes six bake stations. Module 306 also includes a chill station. One or more combination curing/in situ cooling stations of the present invention are incorporated into module 307. A preferred embodiment of module 307 includes six combination of these curing/in situ cooling stations. Cabinet 308 may incorporate central controls for operating tool 300.

Figure 7:
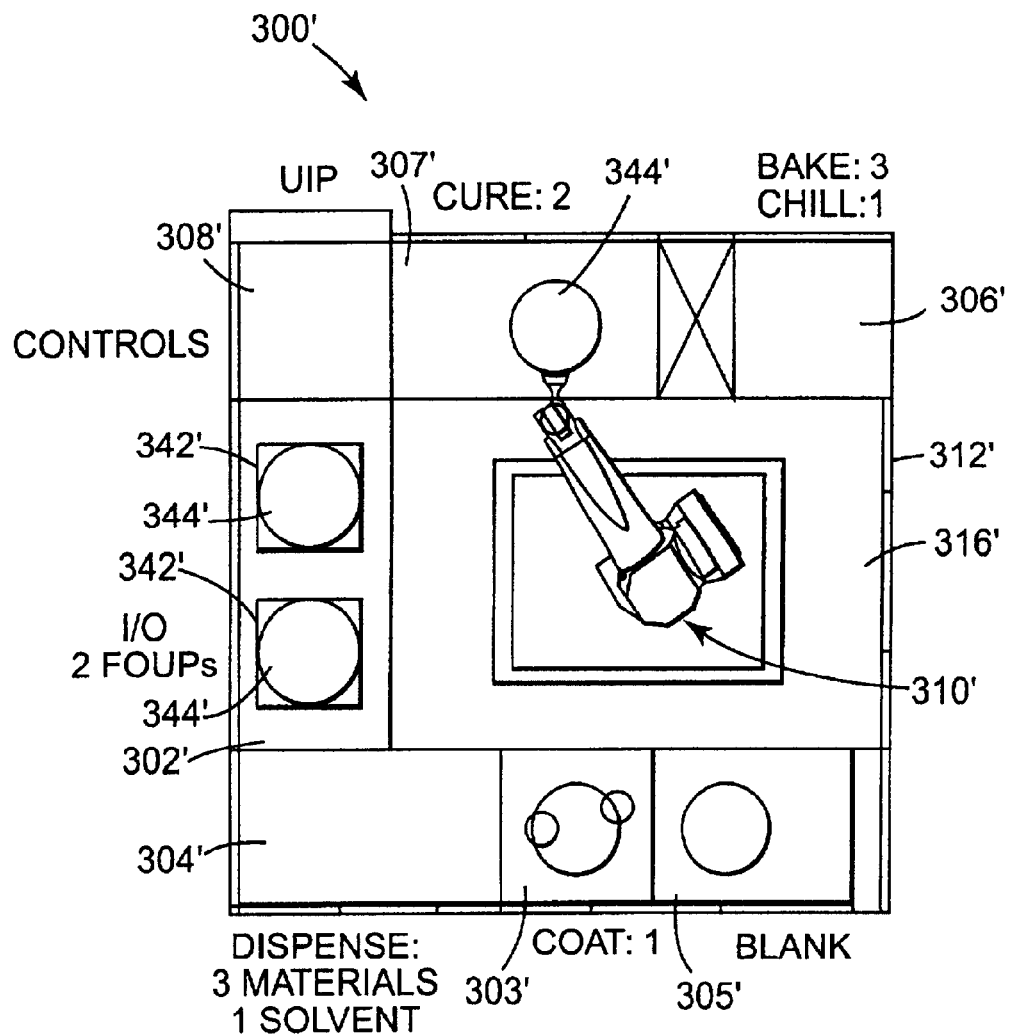
FIG. 7 is a schematic plan view of a tool cluster of the present invention suitable for research and development.

An alternative embodiment of the CALYPSO™ cluster tool 300' is shown in FIG. 7, in which the configuration of tool 300' is suitable for research and development applications. Cluster tool 300' generally includes a plurality of modules 302', 303', 304', 305', 306', 307', and 308' operationally positioned around a central robot 310'. Wall 312' helps to isolate interior region 316'. Module 302' houses a pair of I/O (FOUP) stations. Module 303' houses a single spin coating station and is positioned next to module 304', which houses spin coating chemicals, e.g., a solvent and three different spin coatable fluids in one embodiment. In the current CALYPSO™ design, up to two spin coating stations may be incorporated into module 303'. If more spin coating stations are desired, one or more additional modules may be added to tool 300'. Module 305' is presently blank and may later house additional processing stations for future expansion. Module 306' houses three bake stations and one chill station. Up to four more bake stations may be added to module 306'. Module 307' houses a pair of curing/in situ cooling stations and may hold up to four more of these. Controls are housed in module 308'.

A preferred mode of operation of cluster tools of the present invention will now be described in connection with FIG. 6 and the flow chart 400 shown in FIG. 8. In step 402, robot 310 withdraws a wafer 344 from I/O station 340. Prior to withdrawing the wafer, at that time, or afterwards, in step 404, a process recipe is selected for the wafer. The remainder of the process steps in flowchart 400 will be carried out in accordance with such recipe selection. In step 406, the robot 310 transfers the wafer to a spin-coating station. At that station in accordance with step 408, a spin-coatable composition comprising a curable dielectric precursor and solvent is dispensed onto the wafer as the wafer is rotated. This may be accomplished in one or more coating steps, depending on the materials being used. Spin coating forms a relatively thin, uniform, fluid coating on the wafer comprising the dielectric precursor and the solvent.

In a typical spin coating operation, the composition is dispensed onto the center of a spinning substrate. For example, the spin coating station on the CALYPSO cluster tool includes three nozzles in some applications for dispensing up to 3 different chemicals onto the same or different substrates, usually being dispersed in succession. This 3-nozzle structure is useful for coating the SILK material onto a substrate in a 3-step process of priming, pre-wetting with a solvent, and top coating as recommended by the manufacturer. In each instance, the nozzle being used is translated proximal to the center axis of the rotating substrate in order to carry out the dispense.

Center dispense is a very suitable technique, but some alternative approaches may be used that reduce the volume of dispensed material required to effectively coat the spinning substrate. One such technique involves first pre-wetting the substrate with solvent after which a relatively reduced volume of the dielectric composition is dispensed. Pre-wetting can reduce the needed amount of dielectric composition. An alternative technique involves dispensing the dielectric composition as the nozzle translates radially either outward or inward relative to the spinning substrate. Radial dispensing may also be used in combination with a pre-wetting step. As compared to a center dispense, radial dispensing can reduce the needed volume of dielectric composition by as much as 25%.

After spin coating, edge bead removal (EBR) and/or backside rinse (BSR) treatments may optionally occur. The EBR treatment may occur using any suitable technique. A preferred EBR treatment occurs by cutting the edge bead on the coated wafer with a jet of solvent while the coated wafer spins at a suitable speed. When cutting the edge bead in this manner, some of the dielectric material may move to the backside of the wafer. Accordingly, it is preferred to follow the EBR treatment with a BSR treatment in which the debris on the backside is rinsed off with a solvent while the wafer spins.

Preferably, the EBR and/or BSR treatments occur only after the coated dielectric precursor material has dried to a suitable degree. According to one approach, the coated wafer may be allowed to dry in the spin coating station. However, depending upon the size of the wafer and the thickness of the film, such drying may require from about 1 minute to about 5 minutes. This is particularly the case for a 1 micrometer to 2 micrometer thick coating on a 300 mm wafer. To reduce this drying time, it can be much faster to transfer the coated wafer to a bake station, bake the coated wafer for a few seconds, and then transfer the coated wafer back to a spin coating station at which the EBR and/or BSR treatments occur.

After spin coating and any optional EBR and/or BSR treatments, in accordance with step 410, robot 310 transfers the coated wafer to a bake station. At the bake station, in accordance with step 412, the wafer is baked to remove all or a portion of the solvent so as to prepare the coated film to be cured in a subsequent curing step. Baking generally occurs within a relatively low temperature regime in which the temperature is below the recommended cure temperature and in which the risk of thermal oxidation is at least substantially avoided. The temperature is desirably high enough, however, to allow the solvent to be removed in a reasonable amount of time. Typically, during baking, there is some advancement of the cure of the dielectric material to the so-called B-stage of polymerization. A typical temperature for baking is in the range from about 100° C. to 350° C., preferably about 200° C. to about 325° C. depending upon the material.

It has now been discovered that the presence of residual solvent remaining in the baked coating can have a dramatic impact upon the quality and uniformity of the resultant cured films. Specifically, if all or substantially all (i.e., if the baked coating includes 0.1 weight percent or less of residual solvent based upon the total weight of the baked coating) is removed from the coating during the baking, the quality of the resultant cured dielectric film may vary too much from device to device. Additionally, the resultant cured material itself may be different than what would have been expected based upon the starting precursor material. In contrast, if an amount of residual solvent remains in the coating after baking and is present at the onset of curing, the properties of the resultant cured films are much more uniform. The nature of the cured material itself also correlates better to the starting precursor material. Accordingly, it is preferred to remove all but a relatively small amount of residual solvent in the baking step. Therefore, baked coatings of the present invention preferably include at least about 0.1 weight percent to about 5 weight percent, more preferably 0.5 to 2 weight percent, and most preferably about 1 weight percent of residual solvent based upon the total weight of the baked coating.

With baking complete, the wafer is chilled and then robot 310 transfers the baked wafer from the bake station to a combination cure/in situ cooling station in accordance with step 414. In step 416, the wafer is loaded into the station, the station is purged with $N_2$ or the like to reduce the $O_2$ to the desired level, the baked coating on the wafer is cured, the cured film is then cooled in situ with a cooling gas, and then the cooled wafer is unloaded from station 362. In accordance with step 418, the robot then transfers the wafer to a chill station. There, the wafer is chilled to a desired final temperature in step 420. Robot 310 then transfers the wafer back to an I/O station in step 422 to complete the process for that wafer. The process shown in flowchart 400 may be repeated for a succession of one or more additional wafers using the same and/or different process recipes. After the film is formed, it may thereafter be patterned to form an insulating element or the like using any suitable technique.

In situ cooling in the context of an integrated processing system of the present invention, such as cluster tool 300, provides numerous benefits. First, as described above, in situ cooling helps to protect the wafer from thermal oxidation when the wafer is removed from station 362. This significantly enhances the quality of the resultant dielectric film. Second, robot handling leaves less of an end effector signature upon a cooled wafer, as compared to circumstances when a robot handles a hotter wafer. This, too, enhances the quality of the resultant dielectric film.

Figure 8:
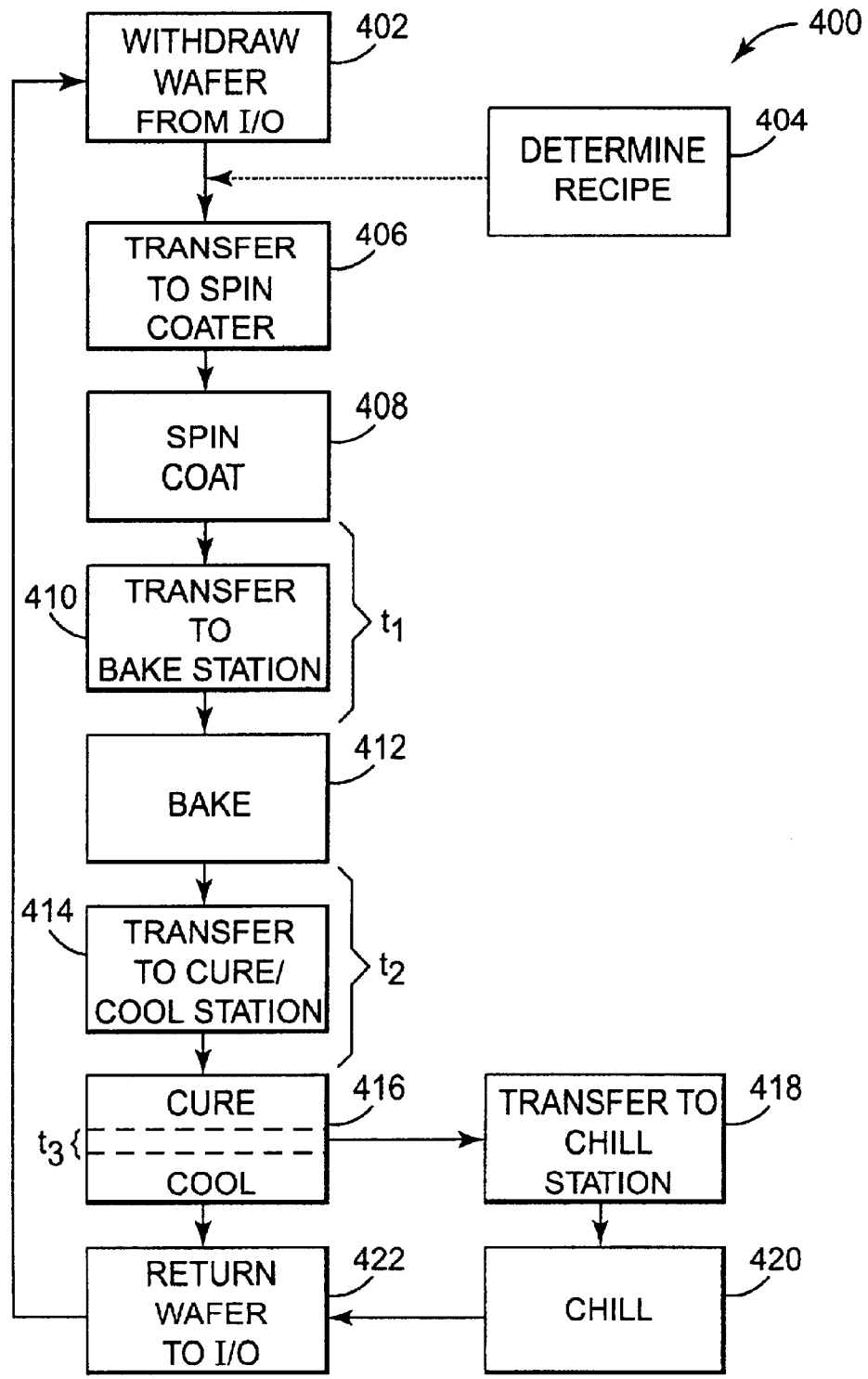
FIG. 8 is a flow chart of one mode of operation of the tool cluster of FIG. 6 for making a low-k spin on dielectric film on a substrate.

Third, with reference to FIG. 8, in situ cooling eliminates any variation in intrastation time period $t_3$ between curing and cooling so that every processed wafer experiences the very same process during the cure and cooling operation. This consistent timing capability not only enhances the quality of the resultant dielectric film, but also dramatically improves the wafer-to-wafer uniformity of cured low-k spin on dielectric films. In contrast, if there is too much variation in the time period $t_3$ between curing and cooling, as is the case for wafers batch cured in a furnace, uniformity is much worse and a unique process signature can be discerned on individual wafers.

In fact, this $t_3$ consistency, preferably in combination with controlling and preferably maintaining consistent interstation transfer times $t_1$ and $t_2$, offers tremendous flexibility and uniformity in processing microelectronic substrates. By making these time periods consistent between the bake, coat, cure, and cool operations, one can be assured that following a particular process recipe will provide a dielectric film of a particular quality with very little variation from substrate to substrate.

For example, a plurality of wafers can be sequentially processed through the system in which each wafer is subjected to the same coating, baking, curing, cooling, and optionally chilling recipe (including the same $t_1$, $t_2$, and $t_3$) to provide substrates bearing low-k dielectric, thin films with excellent wafer-to-wafer thickness uniformity. Moreover, a plurality of wafers can be sequentially processed through the system in any order using two or more recipes, and the groups of wafers processed according to a particular recipe will be virtually indistinguishable from each other. This flexibility also allows substrates to be custom processed on the fly. Such uniformity cannot be achieved as easily when coating, baking, curing, and cooling of spin on dielectric compositions are not integrated into a single, integrated system in which $t_1$, $t_2$, and/or $t_3$ are not as easily controlled or controllable.

Moreover, because cluster tool 300 may include multiple coating, baking, curing/cooling, and chilling stations, respectively, a plurality of wafers may be parallel processed in accordance with one or more recipes. Significantly, and due at least in part to the interstation control over time periods $t_1$ and $t_2$ and the intrastation control of the time period $t_3$ (if any, because one can transition from curing to cooling with essentially no delay such that $t_3$ is zero for practical purposes), uniformity of films prepared according to the same process recipe is exceptional, even though any particular substrate may have been processed on one or more different stations than another substrate.

Accordingly, when subjecting a plurality of substrates to a particular coating, baking, and curing/cooling recipe, it is preferred that at least one of $t_1$, $t_2$, and/or $t_3$ is/are controlled for each of such devices. More preferably, two or more of these time periods are controlled so as to be consistent from substrate to substrate, and most preferably all three of these time periods are controlled and are substantially the same, respectively for the substrates. As used with respect to these time periods, "substantially the same" means that any such time period for a particular substrate varies by no more than 25%, preferably no more than 10%, and most preferably no more than about 1% with respect to the corresponding time period for any other substrate being processed in accordance with such recipe.

Figure 9:
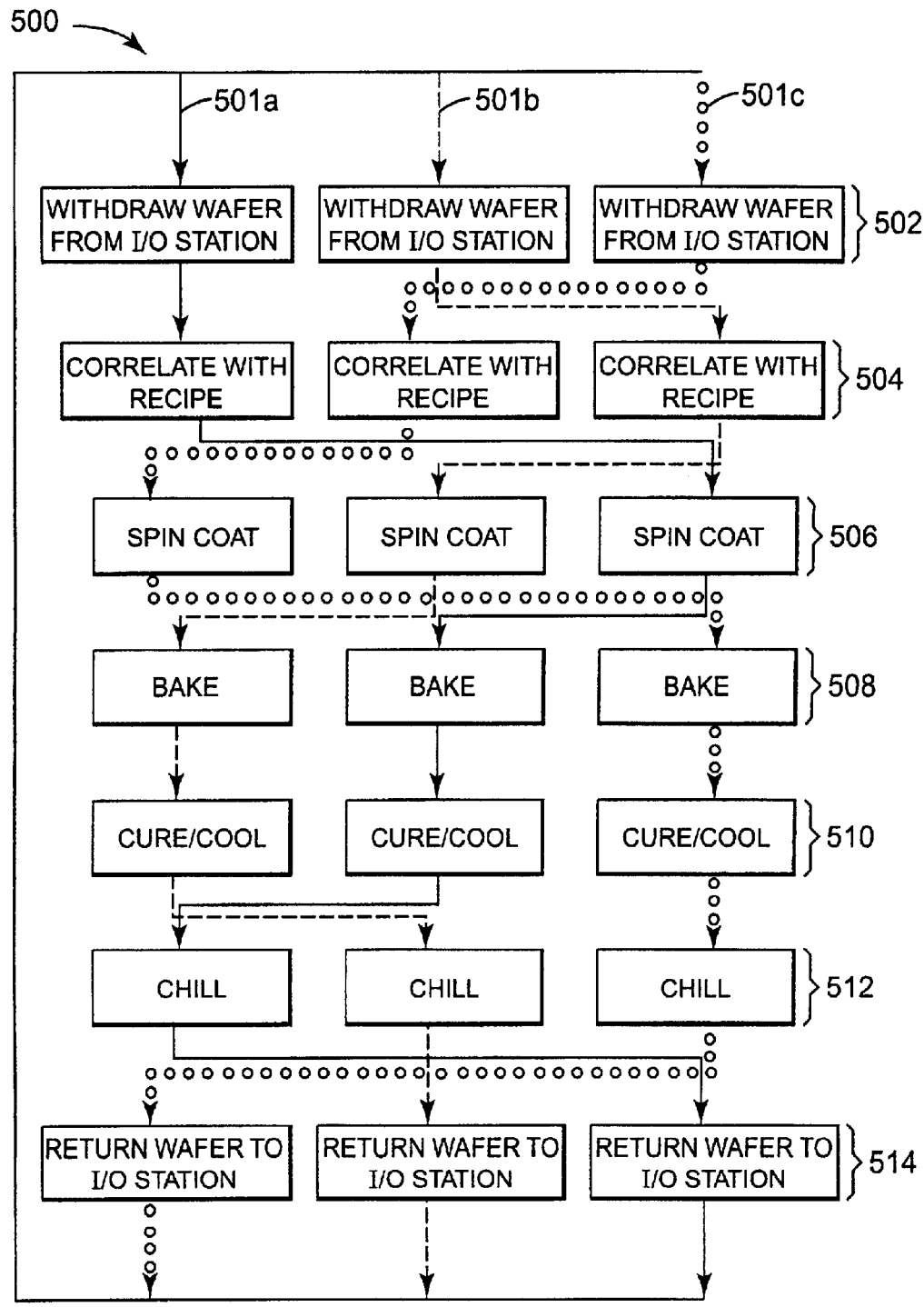
FIG. 9 is a flow chart of another mode of operation of the tool cluster of FIG. 6 in which low-k spin on dielectric films are formed in parallel fashion.

Parallel processing of wafers is schematically illustrated in FIG. 9 by flowchart 500 for a illustrative system that includes a single I/O station, a trio of spin coating stations, a trio of baking stations, a trio of cure/cooling stations, and a trio of chill stations. Flowchart 500 shows the process flow paths 501a, 501b, and 501c for three representative in-process wafers. As schematically shown by the exemplary process flow paths 501a, 501b, and 501c, each wafer is withdrawn from the I/O station in step 502 and is then correlated with a particular recipe, which may be the same or different than the recipes for the other in-process wafers, in step 504. Next, each wafer is subjected to a respective sequence of a coating step 506, a baking step 508, a curing/cooling step 510, a chilling step 512, and a step 514 in which the device is returned to the I/O station. The process can then be repeated for more wafers as desired. If a single recipe is followed for all the wafers, the resultant dielectric films on each wafer will be virtually identical even though any one particular film may have been processed in one or more different stations than other films. If more than one recipe is followed, the resultant films produced according to a particular recipe will be virtually identical to each other.

For maximum throughput, the three wafers are parallel processed. In the practice of the present invention, this does not necessarily mean that a particular trio of wafers is processed through the same steps in tandem, but rather that at least a portion of the coating, baking, and/or curing/cooling operations for one wafer will occur while at least a portion of the coating, baking, and/or curing/cooling operations are occurring for one or both of the other wafers. Further, more than one wafer may be processed in accordance with a particular flow path 501a, 501b, 501c, or the like, at any one time. For example, if one wafer on flow path 501a is at the chilling step 512, one or more other wafers may be following the same flow path at one or more of the other stations. In other words, as soon as an in-process wafer leaves a station and it is unoccupied, another in-process wafer can take its place to maximize throughput.

The present invention will now be further described in connection with the following illustrative examples.

EXAMPLE 1

Low-k spin-on dielectric thin films were formed on a batch of 25 silicon wafers using the CALYPSO® tool cluster. A cassette storing the wafers was placed into the I/O module of the cluster. Each wafer was processed using an identical, predetermined, sequential process controlled through software packaged with the tool.

Each wafer was first transported by the central robot from the I/O module to a coating station where the wafer was coated with an adhesion promoter (AP 4000 available from the Dow Chemical Co.). The AP 4000 adhesion promoter (1 ml) was dispensed onto the center of each wafer while the water spun at 2500 rpm. After this dispense, the central robot transferred the wafer from the coating module to a bake station. The AP 4000 film on the wafer was baked at 200° C. for 60 seconds. The wafer was then transferred by the central robot from the bake station to a chill station for processing at 20° C. for 20 sec. The central robot then moved the chilled wafer back to the coat station. In the coat station, a low-k SILK dielectric precursor (Dow Chemical Co.) was dispensed (1.8 ml to 3 ml) onto the center of the wafer using dynamic dispense at a dispense speed of 1500 rpm. After the dispense, the wafer spin was ramped up to 3600 rpm for 45 seconds. Edge bead removal (EBR) then was performed at 1500 rpm using cyclohexanone at 2 mm from the edge of the wafer. A BSR treatment was also performed using cyclohexanone at a spin speed of 1500 rpm. The wafer was allowed to continue to spin at 3000 rpm for another 10 seconds.

The central robot then moved the wafer to a first INSTACURE™ station to carry out a baking step at 325° C. for 60 seconds. The wafers moved to another INSTACURE™ station with a heated platen maintained at 450° C. The thin film of coated SILK material was cured in the INSTACURE™ station at 450° C. for 180 seconds with the oxygen level maintained at <20 ppm. The cured wafers were cooled in the INSTACURE™ station using nitrogen by lifting the wafers from the heated platen using the pins to support the wafer while maintaining the anaerobic conditions. Once the wafers were cooled to below 325° C., the wafers were then transferred to a chill plate maintained at 20° C. for 20 sec. The processed wafer was then returned to its cassette.

During loading of the wafer into the INSTACURE™ station, nitrogen flowed through the outer plenum of the station at 55 standard $ft^3$/hr (SCFH) as the wafer was placed on the lift pinspins. After the door closure, when the wafer was still supported on the pins, the nitrogen flowed through both inner and outer plenums of the lid at 55 SCFH and 45 SCFH, respectively. During the curing, nitrogen flowed through the inner plenum only at 45 SCFH. When the wafer was cooled on the pins, nitrogen flowed through the inner and outer plenums at 55 SCFH and 45 SCFH, respectively.

The thickness of the resultant SILK thin film on each wafer was measured using the instrument commercially available from Nanometrics. The average thickness of was about 5000 angstroms with thickness uniformity of $\leq 0.15\%$ (1 sigma).

For comparison purposes, a batch of 25 wafers was processed in similar manner, except that the comparison wafers were cured in a furnace (ex-situ) at 400° C. for 60 minutes and cooled ex situ. Various properties of both the wafers processed in the CALYPSO® tool and the comparison wafers were measured. The wafers processed in the CALYPSO® tool showed improved lower average refractive index of 1.6089 as compared to furnace cured film with an average refractive index of 1.6206. This and other data are reported in the following Table 1:

TABLE 1

| SILK Film Property | INSTACURE ™ (450° C. for 3 min) | Furnace Cured (400° C. for 60 min) |
| --- | --- | --- |
| Refractive Index (Rudolph) | 1.6089 (633 nm) | 1.6206 (633 nm) |
| Thickness Uniformity | ≦0.15% (1 sigma) | ≦0.25% (1 sigma) |
| Refractive Index | 1.904 (314 nm) | 1.915 (314 nm) |

TABLE 1-continued

| SILK Film Property | INSTACURE ™ (450° C. for 3 min) | Furnace Cured (400° C. for 60 min) |
|---|---|---|
| Refractive Index Uniformity | 0.016 (1 sigma) | 0.02 (1 sigma) |
| Thermal Stability (TE-GC-Mass) | Less out-gassing | More out-gassing |
| Elastic Modulus (Gpa) | 4.2 | 3.86 |

EXAMPLE 2

Low-k spin-on dielectric thin films were formed on a batch of 25 silicon wafers using the CALYPSO® tool cluster. A cassette storing the wafers was placed into the I/O module of the cluster. Each wafer was processed using an identical, predetermined, sequential process controlled through software packaged with the tool.

To carry out the process, a wafer was transferred by the robot to the coat station. A low-k SILK (new version, no adhesion promoter needed) dielectric precursor (Dow Chemical Co.) dielectric precursor solution was dispensed (1.8 ml to 3 ml) onto the center of the wafer using dynamic dispense at a dispense speed of 1500 rpm. After the dispense, the wafer spin speed was ramped up to 3600 rpm for 45 seconds. Edge bead removal (EBR) then was performed at 1500 rpm using cyclohexanone at 2 mm from the edge of the wafer. A BSR treatment was also performed using cyclohexanone at a spin speed of 1500 rpm. The wafer was allowed to continue to spin at 3000 rpm for another 10 seconds.

The central robot then moved the wafer to a first INSTACURE™ station to carry out a baking step at 325° C. for 60 seconds. The wafers were then moved to another INSTACURE™ station with a preheated platen maintained at 450° C. The thin film of coated SILK material was cured in the INSTACURE™ station at 450° C. for 180 seconds with the oxygen level maintained at <20 ppm. The cured wafer was cooled in the INSTACURE™ station using nitrogen to a temperature below 325° C. while maintaining the anaerobic conditions. The wafer was then transferred to a chill plate maintained at 20° C. for 20 sec. The processed wafer was then returned to the cassette.

During loading, nitrogen flowed through the outer plenum at 55 SCFH. After the door closure, when the wafer is still on the pins, the nitrogen flowed through both inner and outer plenums at 55 SCFH and 45 SCFH, respectively. During the curing, the nitrogen flowed through the inner plenum only at 45 SCFH. When the wafer was cooled on the lift pins, nitrogen flowed through inner and outer plenums at 55 SCFH and 45 SCFH, respectively.

The thickness of the SILK thin film on each wafer was measured using the instrument commercially available from Nanometrics. The average thickness was about 5900 angstroms with thickness uniformity of ≦0.15% (1 sigma). The refractive index of the film at 314 nm was 1.907.

EXAMPLE 3

In a manner similar to Example 2, 300 mm wafers were processed on the CALYPSO™ cluster tool. However, the wafers were coated with the SILK low-k dielectric percursor while each wafer spun at 1700 rpm. Additionally, the wafers were cooled in-situ to below 300° C. before being chilled and transferred back to the cassette.

The average thickness of the resultant films was measured as 10,000 angstroms with a uniformity of <0.25% (1 sigma). The average refractive index measured at 314 nm was found to be 1.904.

EXAMPLE 4

Low-k spin-on dielectric thin films were formed on a batch of 25 silicon wafers using the CALYPSO® cluster tool. A cassette storing the wafers was placed into the I/O module of the tool. Each wafer was processed using an identical, predetermined, sequential process controlled through software packaged with the tool.

To carry out the process, the central robot moved a wafer to the coat station. A low-k FLARE dielectric precursor (Honeywell) was dispensed (2.5 ml) onto the center of the wafer using dynamic dispense at a dispense speed of 1500 rpm. After the dispense, the wafer spin speed was ramped up to 3600 rpm for 40 seconds. Edge bead removal (EBR) then was performed at 1500 rpm using cyclohexanone at 2 mm from the edge of the wafer. A BSR treatment was also performed using cyclohexanone at a spin speed of 1500 rpm. The wafer was allowed to continue to spin at 3000 rpm for another 10 seconds.

The central robot then moved the wafers to a succession of bake stations maintained at 150° C., 200° C., 250° C., respectively. The baking was perfromed for 60 seconds at each temperature. The wafers were then moved to an INSTACURE™ station with a preheated platen maintained at 450° C. The thin film of coated FLARE material was cured in the INSTACURE™ station at 450° C. for 180 seconds with the oxygen level maintained at <20 ppm. The cured wafer was cooled in the INSTACURE™ station using nitrogen to a temperature below 325° C. while maintaining the anaerobic conditions. The wafer was then transferred to a chill plate maintained at 20° C. for 20 sec. The processed wafer was then returned to the cassette.

During the loading, the nitrogen flowed through the outer plenum at 55 SCFH. After the door closure, before the wafer was lowered into thermal contact with the heated platen, nitrogen flowed through both inner and outer plenums at 55 SCFH and 45 SCFH, respectively. During curing, nitrogen flowed through the inner plenum only at 55 SCFH. During cooling, nitrogen flowed through inner and outer plenums at 55 SCFH and 45 SCFH, respectively.

The thickness of the FLARE thin film on each wafer was measured using the instrument commercially available from Nanometrics. The average thickness was about 5990 angstroms with a thickness uniformity of ≦0.15% (1 sigma).

For comparison purposes, a batch of 25 wafers was processed in similar manner, except that the comparison wafers were cured in a furnace (ex-situ) at 400° C. for 60 minutes and cooled ex situ. Various properties of the wafers processed in the CALYPSO® tool and the comparison wafers were measured. The wafers processed in the CALYPSO® tool showed improved lower average refractive index of 1.6089 compared to furnace cured film with an average refractive index of 1.6206. This and other data are reported in the following Table 2:

TABLE 2

| SILK Film Property | Instacured (450° C. for 3 min) | Furnace Cured (420° C. for 60 min) |
|---|---|---|
| Refractive Index (Whoolam) | 1.669 (633 nm) | 1.68 (633 nm) |
| Thickness Uniformity | ≦0.15% (1 sigma) | ≦0.20% (1 sigma) |
| Thermal Stability (TE-GC-Mass) | Less out-gassing | More out-gassing |
| Elastic Modulus (Gpa) | 5.77 | 5.33 |
| Hardness (Gpa) | 0.384 | 0.363 |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the scope and spirit of the present invention which is indicated by the following claims.

What is claimed is:

1. A method of forming a cured, dielectric composition on a substrate, comprising the steps of:
   (a) coating a composition comprising a thermally curable, dielectric precursor onto at least a portion of the substrate;
   (b) causing the coated substrate to be positioned in a process chamber;
   (c) while the coated substrate is positioned in the process chamber:
      (i) thermally curing the dielectric precursor to form the cured dielectric composition, wherein at least a portion of the thermal curing occurs under anaerobic conditions; and
      (ii) causing a gas to coolingly contact the cure dielectric composition; and
   (d) after said gas coolingly contacts the cured dielectric composition, removing the coated substrate from the process chamber.

2. The method of claim 1, wherein the dielectric precursor comprises an organic prepolymer component.

3. The method of claim 1, wherein the dielectric precursor comprises an organic prepolymer component, and wherein at least a portion of said gas cooling occurs under anaerobic conditions.

4. The method of claim 3, wherein at least substantially all of the thermal curing and cooling gas contact occur under anaerobic conditions.

5. The method of claim 2, wherein the anaerobic conditions comprise thermally processing the coated substrate in an anaerobic environment comprising no more than about 200 ppm oxygen.

6. The method of claim 4, wherein the anaerobic environment comprises no more than about 200 ppm oxygen.

7. The method of claim 1, wherein the dielectric precursor comprises an inorganic prepolymer component, and wherein at least a portion of said gas cooling occur under anaerobic conditions.

8. The method of claim 1, wherein a side door operationally engages a portal through which a substrate to be processed is transferred to and from the process chamber.

9. The method of claim 1, wherein the coating step comprises spin coating the composition comprising the curable dielectric precursor onto the substrate.

10. The method of claim 1, wherein said dielectric precursor has a cure temperature, the coated composition comprises a solvent, and thermal curing occurs at a temperature at or above the cure temperature, and wherein the method further comprises the step of, after coating but prior to curing, causing the coated composition to be pre-baked at a temperature below the cure temperature in order to remove at least a portion of the solvent.

11. The method of claim 10, wherein said pre-baking occurs under conditions such that the coated composition comprises an amount of residual solvent.

12. The method of claim 11, wherein said amount of residual solvent comprises from about 0.5 to about 5 weight percent of solvent of the total solvent included in the composition at the time of coating.

13. The method of claim 1, wherein at least a portion the thermal curing step occurs under vaccuum.

14. The method of claim 1, wherein the anaerobic conditions comprise less than 20 ppm oxygen.

15. A method of forming dielectric compositions on a plurality of substrates, comprising the steps of:
   (a) coating a composition comprising a curable dielectric precursor onto a first substrate;
   (b) causing the coated substrate to be prebaked, said prebaking being initiated after a first time interval from the end of the coating step;
   (c) causing the coated substrate to be thermally cured, said thermal curing being initiated after a second time interval from the end of the pre-baking step wherein at least a portion of the thermal curing occurs under anaerobic conditions;
   (d) causing the thermally cured substrate to be cooled, said cooling being initiated after a third time interval from the end of the thermal curing step; and
   (e) repeating steps (a) through (d) for at least one additional substrate, wherein the respective second time intervals for each of the first coated substrate and the at least one additional coated substrate are substantially the same.

16. The method of claim 15, wherein the respective first time intervals for each of the first coated substrate and the at least one additional coated substrate are substantially the same.

17. The method of claim 15, wherein the respective third time intervals for each of the first coated substrate and the at least one additional coated substrate are substantially the same.

18. The method of claim 17, wherein the respective first time intervals for each of the first coated substrate and the at least one additional coated substrate are substantially the same.

19. The method of claim 15, wherein at least a portion of the cooling occurs by causing a gas to coolingly contact the thermally cured substrate, and wherein the thermal curing and said cooling gas contact occur in the same process chamber.

20. The method of claim 15, wherein the dielectric precursor comprises an organic prepolymer component.

21. The method of claim 16, wherein the dielectric precursor comprises an organic prepolymer component and wherein at least a portion of said thermal curing and said cooling gas contact occur under anaerobic conditions.

22. The method of claim 19, wherein at least substantially all of the thermal curing and cooling gas contact occur under anaerobic conditions.

23. The method of claim 15, wherein at least a portion of the thermal curing step occurs under vaccuum.

24. A method of forming a cured, dielectric composition on a substrate, comprising the steps of:
   (a) coating a composition comprising a thermally curable, dielectric precursor and an amount of solvent such that the composition has a coatable viscosity onto at least a portion of the substrate;
   (b) pre-baking the coated substrate at a first, relatively low temperature profile under conditions such that at least a portion of the coated dielectric precursor is uncured and the coated composition comprises a residual amount of solvent;
   (c) thermally curing the dielectric precursor at a second, relatively high temperature profile under conditions such that at least substantially all of the dielectric precursor is cured to form the dielectric composition wherein at least a portion of the thermal curing occurs under anaerobic conditions; and
   (d) cooling the cured dielectric composition.

25. A method of forming respective dielectric compositions on a plurality of substrates, comprising the steps of:

(a) causing a first composition comprising a first dielectric precursor to be coated onto a first substrate;

(b) causing the coated, first substrate to be positioned in a processing chamber;

(c) while the first substrate is positioned in the processing chamber:

(i) causing the first substrate to be in thermal contact with a heat source under conditions effective to thermally cure the first, coated substrate, wherein at least a portion of the thermal curing occurs under anaerobic conditions; and (ii) causing a gas to coolingly contact the thermally cured, first substrate; and (d) repeating steps (a) through (c) for a second substrate.

26. The method of claim 25, wherein at least a portion of at least one of the repeated steps (a) through (c) occurs while at least a portion of at least one of said steps (a) through (c) is carried out with respect to the first substrate.

27. The method of claim 25, wherein said coating, positioning, thermal curing, and cooling steps are carried out in a cluster tool comprising at least one input/output module, at least one coating module, and at least one combination cure/cool module.

28. The method of claim 27, wherein the tool comprises at least two cure/cool modules and at least a portion of the curing step for the first substrate occurs while at least a portion of the curing step for the second substrate is occurring.

29. The method of claim 27, wherein the tool comprises at least two cure/cool modules and at least a portion of the gas cooling step for the first substrate occurs while at least a portion of the gas cooling step for the second substrate is occurring.

30. The method of claim 27, wherein the tool comprises at least two cure/cool modules and at least a portion of the gas cooling step for the first substrate occurs while at least a portion of the gas cooling step for the second substrate is occurring.

31. The method of claim 25, wherein each of the first and second substrates are processed in parallel according to first and second process recipes, respectively, said first and second process recipes being different.

32. The method of claim 29, wherein each of the first and second substrates are processed in parallel according to first and second process recipes, respectively, said first and second process recipes being substantially identical.

33. The method of claim 25, further comprising subjecting each of the first and second coated substrates to respective pre-bake treatments, said pre-bake treatments occurring prior to thermal curing.

34. The method of claim 33, wherein thermal curing of the first coated substrate is initiated after a first time interval from the end of the corresponding pre-bake treatment and thermal curing of the second coated substrate is initiated after a second time interval from the corresponding pre-bake treatment, said first and second time intervals being substantially identical.

35. The method of claim 34, wherein each of the first and second substrates are processed sequentially according to first and second recipes, respectively, said first and second recipes being substantially identical.

36. The method of claim 34, wherein each of the first and second substrates are processed sequentially according to first and second recipes, respectively, said first and second recipes being different from each other.

37. The method of claim 25, wherein the anaerobic conditions comprise less than 20 ppm oxygen.

38. A method of forming respective dielectric compositions on a plurality of substrates, comprising the steps of:

(a) providing first and second groups of substrates, each of said groups comprising at least one substrate to be processed;

(b) in accordance with a first process recipe:

(i) causing a first composition comprising a first dielectric precursor to be coated onto each substrate in the first substrate group;

(ii) causing each of the coated, substrates of the first group to be positioned in a processing chamber;

(iii) while each of the substrates of the first group is positioned in the processing chamber: causing each such coated substrate of the first group to be in thermal contact with a heat source under conditions effective to thermally cure such coated substrate, wherein at least a portion of the thermal curing occurs under anaerobic conditions; and causing a gas to coolingly contact each of the thermally cured, first substrates; and (c) in accordance with a second process recipe different than the first process recipe, repeating step (b) for each of the substrates in the second group.

39. The method of claim 38, wherein the anaerobic conditions comprise less than 20 ppm oxygen.

* * * * *

UNITED STATES PATENT AND TRADEMARK OFFICE
CERTIFICATE OF CORRECTION

PATENT NO. : 6,838,115 B2
DATED : January 4, 2005
INVENTOR(S) : Devendra Kumar et al.

It is certified that error appears in the above-identified patent and that said Letters Patent is hereby corrected as shown below:

Column 25,
Line 21, delete "cure" and insert in place thereof -- cured --.
Line 43, delete "occur" and insert in place thereof -- occurs --.
Line 66, delete "portion the" and insert in place thereof -- portion of the --.
Line 67, delete "vaccuum" and insert in place thereof -- vacuum --.

Column 26,
Line 49, delete "vaccuum" and insert in place thereof -- vacuum --.

Signed and Sealed this

Seventeenth Day of May, 2005

JON W. DUDAS
*Director of the United States Patent and Trademark Office*